(12) United States Patent
Itoh et al.

(10) Patent No.: US 7,988,305 B2
(45) Date of Patent: Aug. 2, 2011

(54) PROJECTION TYPE DISPLAY DEVICE AND LIGHT SOURCE DEVICE

(75) Inventors: Tatsuo Itoh, Osaka (JP); Tetsuro Mizushima, Osaka (JP); Kenichi Kasazumi, Osaka (JP); Kazuhisa Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 461 days.

(21) Appl. No.: 12/293,668

(22) PCT Filed: Mar. 22, 2007

(86) PCT No.: PCT/JP2007/055857
§ 371 (c)(1),
(2), (4) Date: Sep. 19, 2008

(87) PCT Pub. No.: WO2007/108504
PCT Pub. Date: Sep. 27, 2007

(65) Prior Publication Data
US 2010/0231862 A1    Sep. 16, 2010

(30) Foreign Application Priority Data
Mar. 23, 2006    (JP) .................. 2006-080272

(51) Int. Cl.
*G03B 21/26* (2006.01)
*G02B 26/08* (2006.01)
*G02B 26/10* (2006.01)
*G02B 26/12* (2006.01)

(52) U.S. Cl. ................. 353/94; 359/210.2

(58) Field of Classification Search .......... 353/94, 353/30, 31, 102, 38, 101; 359/207.6, 210.1, 359/210.2, 209.1, 619, 623, 624; 372/43.01–50.23; 362/311.01, 311.06–311.1, 326, 330, 331, 362/336, 553, 259, 277; 385/133, 901
See application file for complete search history.

(56) References Cited

U.S. PATENT DOCUMENTS 7,090,359 B2 * 8/2006 Kim et al. .................... 353/102
(Continued)

FOREIGN PATENT DOCUMENTS

JP    6-188488    7/1994
(Continued)

OTHER PUBLICATIONS

International Search Report issued Apr. 17, 2007 in the International (PCT) Application No. PCT/JP2007/055857.

*Primary Examiner* — William C Dowling
*Assistant Examiner* — Ryan Howard
(74) *Attorney, Agent, or Firm* — Wenderoth, Lind & Ponack, L.L.P.

(57) ABSTRACT

Miniaturization is realized and high-output lights are obtained by optimizing the arrangement of a laser light source unit and a homogenizer.

A laser light source unit 1 has a light emission region for emitting an elliptical laser light. A focusing lens unit 2 focuses the laser light emitted from the laser light source unit 1. A rod integrator 4 has a rectangular incident surface on luminous flux focused by the focusing lens unit 2. A spatial light modulation element 7 modulates the laser light emitted from the rod integrator 4. A projection lens 8 projects the laser light modulated by the spatial light modulation element 7. The incident surface of the rod integrator 4 has a rectangular shape, and the laser light source unit 1 is arranged such that a longer axis direction of the light emission region and a longer side direction of the incident surface of the rod integrator are parallel.

23 Claims, 15 Drawing Sheets

U.S. PATENT DOCUMENTS

| | | |
|---|---|---|
| 7,646,518 B2 * | 1/2010 | Kasazumi .................. 359/196.1 |
| 7,768,686 B2 * | 8/2010 | Stenton ..................... 359/211.3 |
| 2004/0105482 A1 | 6/2004 | Sugiyama et al. |
| 2004/0164309 A1 | 8/2004 | Okano et al. |

FOREIGN PATENT DOCUMENTS

| | | |
|---|---|---|
| JP | 11064789 A * | 3/1999 |
| JP | 2003-347647 | 12/2003 |
| JP | 2004-184437 | 7/2004 |
| JP | 2004-186233 | 7/2004 |
| JP | 2005-99160 | 4/2005 |
| JP | 2005-128236 | 5/2005 |
| JP | 2005-292642 | 10/2005 |
| JP | 2005-300712 | 10/2005 |
| JP | 2006-10741 | 1/2006 |
| WO | 2005/057271 | 6/2005 |

* cited by examiner

FIG.6
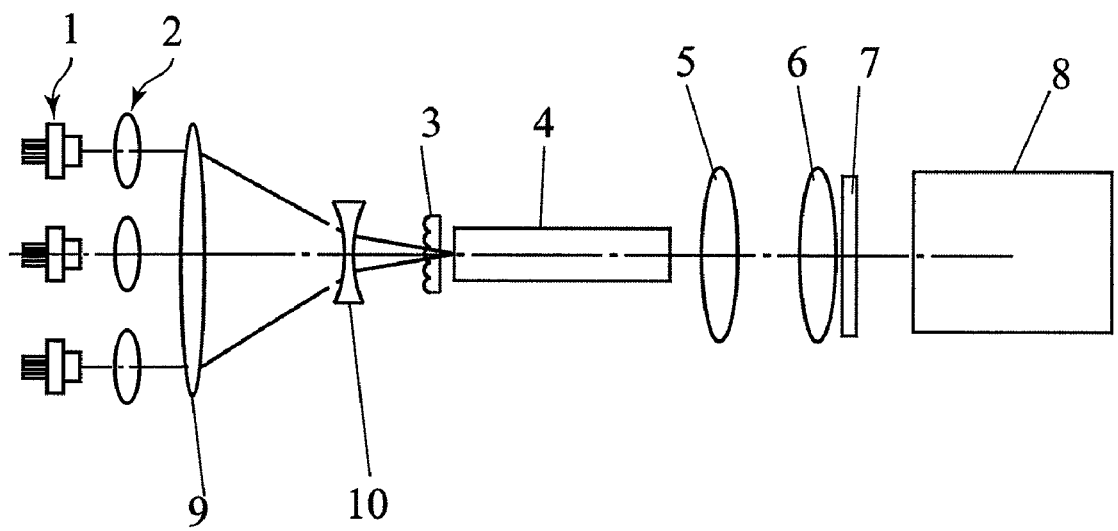
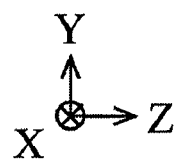

PROJECTION TYPE DISPLAY DEVICE AND LIGHT SOURCE DEVICE

TECHNICAL FIELD

The present invention relates to a projection type display device and a light source device using a laser light source.

BACKGROUND ART

Front projection type display devices and rear projection type display devices using a spatial light modulation element such as a transmissive/reflective liquid crystal element or a micromirror array are known as large-screen display devices. The front projection type display devices and the rear projection type display devices are divided into a type in which three spatial light modulation elements are provided in correspondence with three primary colors of red, green and blue to form a color image and a type in which lights of three primary colors are projected to one spatial light modulation element in a time sharing manner to combine a color image. An ultra high pressure mercury lamp has been conventionally used as a light source of a projection type display device. However, with the recent years' commercialization of high-output blue semiconductor lasers, a projection type display device using laser light sources of three primary colors including a red semiconductor laser and a green laser by second harmonic generation (hereinafter, abbreviated as "SHG") is being developed.

By using laser lights as monochromatic lights as light sources, it becomes possible to realize a projection type display device with a wider reproducible color range and small power consumption. A high-output light source is necessary to obtain a bright screen in the projection type display device. However, there is a limit in the output obtained by one semiconductor laser. Thus, a method for obtaining a high-output light by combining laser lights emitted from a plurality of semiconductor lasers is necessary. A known conventional projection type display device is such that a high output is obtained by multiplexing lights from solid-state light emitting elements using a focusing lens (see, for example, patent literature 1).

FIG. 12 is a diagram showing the construction of a conventional projection type display device disclosed in patent literature 1. In FIG. 12, lights emitted from solid-state light sources 101 are collimated by a lens array 102 and focused to a rod integrator 104 by a focusing lens 103. These lights are repeatedly reflected in the rod integrator 104, so that a uniform light quantity distribution can be obtained on an emergent end surface of the rod integrator 104. The emergent lights from the rod integrator 104 are irradiated to a liquid crystal spatial light modulation element 107 via a relay lens 105 and a field lens 106 to obtain uniform illumination lights.

An image on the liquid crystal spatial light modulation element 107 is projected onto an unillustrated screen by a projection lens 108. The rod integrator 104 is a rectangular parallelepipedic optical element made of glass, and the shapes of the incident and emergent surfaces thereof are similar to that of a part of the liquid crystal spatial light modulation element to be illuminated. In recent years, display screens have been more and more widened and many screens have an aspect ratio of 16:9. Accordingly, spatial light modulation elements and rod integrators also have the aspect ratio of 16:9.

Light emitting diodes, ultra high pressure mercury lamps and the like are used as solid-state light emitting elements in conventional projection type display devices. Divergent angles and light emission regions of the light emitting diodes and ultra high pressure mercury lamps are symmetric with respect to the optical axis of the rod integrator. Thus, in the conventional projection type display device, it is not necessary to particularly consider the arrangement of the light sources and the rod integrator and they can be treated as simple point light sources.

Accordingly, it is disclosed in patent literature 1 that a polarization converter is unnecessary in the construction of the conventional projection type display device in the case of using semiconductor lasers for emitting linearly polarized lights as solid-state light emitting elements, but other characteristics of the semiconductor lasers are not mentioned at all. FIG. 13 is a perspective view showing the construction of a semiconductor laser.

In FIG. 13, a semiconductor laser chip 109 includes an active layer 110 and a clad layer 111. If a current is applied to the semiconductor laser chip 109 via an unillustrated electrode, a laser light is emitted from a light emission region 112 of the active layer 110 restricted by the clad layer 111. Since the thickness of the active layer 110 is about 1 micron, energy density in the light emission region 112 increases to reach an end surface destruction if the laser light becomes a high output. Accordingly, in a high-output semiconductor laser, a length of the light emission region 112 in an X-axis direction (hereinafter, "stripe width") is as large as 10 to 200 microns in order to avoid the end surface destruction.

A divergent angle of the laser light emitted from the semiconductor laser is 20 to 40° in Y-direction and 10 to 15° in X-direction in FIG. 13 at full width half maximum. Accordingly, if the laser light emitted from the light emission region 112 is focused by a focusing lens, focused spots having largely different aspect ratios can be formed. In this way, the emitted light from the semiconductor laser differs from the one from the light emitting diode, has a large divergent angle and a large anisotropy of the light emitting region, and cannot be handled as a simple point light source. Nevertheless, the arrangement of the rod integrator and the semiconductor lasers are not described in detail in the above patent literature 1.

An optimal value of an angle between the optical axis of the rod integrator and the outermost rays of the incident beam is determined by a relationship with an F-number of the projection lens. Since the collimated lights from the solid-state light emitting elements are focused to the rod integrator by the focusing lens in patent literature 1, a ratio of the aperture diameter of the focusing lens to a focal length directly becomes an angle of the light incident on the rod integrator. If an attempt is made to increase the number of the solid-state light emitting elements while keeping this angle, the aperture diameter of the focusing lens increases and the focal length invariably increases, which has presented a problem of enlarging the device.

[Patent Literature 1]

Japanese Unexamined Patent Publication No. 2005-300712

In order to solve the above problem, an object of the present invention is to provide a projection type display device and a light source device capable of being miniaturized and obtaining high-output lights by optimizing the arrangement of a laser light source and a homogenizer.

One aspect of the present invention is directed to a projection type display device, comprising a laser light source unit having a light emission region for emitting an elliptical laser light; a focusing lens unit for focusing the laser light emitted from the laser light source unit; a homogenizer having a rectangular incident surface on luminous flux focused by the focusing lens unit; a spatial light modulation element for modulating the laser light emitted from the homogenizer; and a projection lens for projecting the laser light modulated by the spatial light modulation element, wherein the incident surface of the homogenizer has a rectangular shape and the laser light source unit is arranged such that a longer axis direction of the light emission region and a longer side direction of the incident surface of the homogenizer are parallel.

With this construction, the laser light source unit has the light emission region for emitting an elliptical laser light, and the laser light emitted from the laser light source unit is focused by the focusing lens unit. The homogenizer is so arranged as to locate the rectangular incident surface on the luminous flux focused by the focusing lens unit, the laser light emitted from the homogenizer is modulated by the spatial light modulation element and the laser light modulated by the spatial light modulation element is projected by the projection lens. The incident surface of the homogenizer has a rectangular shape and the laser light source unit is arranged such that the longer axis direction of the light emission region and the longer side direction of the incident surface of the homogenizer are parallel.

Since the laser light source unit is arranged such that the longer axis direction of the light emission region and the longer side direction of the incident surface of the homogenizer are parallel, the laser light emitted from the laser light source unit can be efficiently introduced to the homogenizer and the arrangement of the laser light source unit and the homogenizer is optimized, wherefore miniaturization can be realized and high-output lights can be obtained from the homogenizer.

Another aspect of the present invention is directed to a light source device, comprising a laser light source unit having a light emission region for emitting an elliptical laser light; a focusing lens unit for focusing the laser light emitted from the laser light source unit; and a homogenizer having a rectangular incident surface on luminous flux focused by the focusing lens unit, wherein the incident surface of the homogenizer has a rectangular shape and the laser light source unit is arranged such that a longer axis direction of the light emission region and a longer side direction of the incident surface of the homogenizer are parallel.

With this construction, the laser light source unit has the light emission region for emitting an elliptical laser light, the laser light emitted from the laser light source unit is focused by the focusing lens unit, and the homogenizer is arranged to locate the rectangular incident surface on the luminous flux focused by the focusing lens unit. The incident surface of the homogenizer has a rectangular shape and the laser light source unit is arranged such that the longer axis direction of the light emission region and the longer side direction of the incident surface of the homogenizer are parallel.

Since the laser light source unit is arranged such that the longer axis direction of the light emission region and the longer side direction of the incident surface of the homogenizer are parallel, the laser light emitted from the laser light source unit can be efficiently introduced to the homogenizer and the arrangement of the laser light source unit and the homogenizer is optimized, wherefore miniaturization can be realized and high-output lights can be obtained from the homogenizer.

Still another aspect of the present invention is directed to a projection type display device, comprising a plurality of laser light sources; a plurality of focusing lenses provided in a one-to-one correspondence with the plurality of laser light sources for focusing the laser lights emitted from the plurality of laser light sources; a homogenizer having a rectangular incident surface on luminous fluxes focused by the plurality of focusing lenses; a spatial light modulation element for modulating the laser lights emitted from the homogenizer; and a projection lens for projecting the laser lights modulated by the spatial light modulation element, wherein the plurality of laser light sources include a red laser light source for emitting a red laser light, a blue laser light source for emitting a blue laser light and a green laser light source for emitting a green laser light; the red and blue laser light sources are arranged symmetrically with respect to the optical axis of the homogenizer; the green laser light source is arranged on the optical axis of the homogenizer; the plurality of focusing lenses include a focusing lens for red for focusing a red laser light emitted from the red laser light source on the incident surface of the homogenizer, a focusing lens for blue for focusing a blue laser light emitted from the blue laser light source on the incident surface of the homogenizer and a focusing lens for green for focusing a green laser light emitted from the green laser light before being incident on the homogenizer; and an angle between the optical axis of the homogenizer and the outermost edge of the green laser light at a focal point of the focusing lens for green is equal to an angle between the optical axis of the homogenizer and the red or blue laser light at a focal point of the focusing lens for red or the focusing lens for blue.

With this construction, the laser lights emitted from the plurality of laser light sources are focused by the plurality of focusing lenses provided in a one-to-one correspondence with the plurality of laser light sources. The homogenizer has the rectangular incident surface on the luminous fluxes focused by the plurality of focusing lenses, the laser lights emitted from the homogenizer are modulated by the spatial light modulation element and the laser lights modulated by the spatial light modulation element are projected by the projection lens. The red laser light source for emitting a red laser light and the blue laser light source for emitting a blue laser light are arranged symmetrically with respect to the optical axis of the homogenizer, and the green laser light source for emitting a green laser light is arranged on the optical axis of the homogenizer. The red laser light emitted from the red laser light source is focused on one point by the focusing lens for red, the blue laser light emitted from the blue laser light source is focused on one point by the focusing lens for blue, and the green laser light emitted from the green laser light source is focused by the focusing lens for green before being incident on the homogenizer. The angle between the optical axis of the homogenizer and the outermost edge of the green laser light at the focal point of the focusing lens for green is equal to the angle between the optical axis of the homogenizer and the red or blue laser light at the focal point of the focusing lens for red or blue.

Accordingly, the green laser light source having a more complicated construction than the red and blue laser light sources as semiconductor lasers is arranged on the optical axis of the homogenizer. Thus, the miniaturization of the device can be realized. Even if the green laser light source is arranged on the optical axis of the homogenizer, the green laser light is incident at a specified angle to the incident surface of the homogenizer. Thus, the light quantity distribution of the green laser light can be homogenized approximately to the same extent as those of the red and blue laser lights, wherefore the occurrence of color nonuniformity can be suppressed.

BRIEF DESCRIPTION OF THE DRAWINGS

FIG. 6 is a diagram showing the construction of a projection type display device according to a second embodiment of the invention.

BEST MODES FOR EMBODYING THE INVENTION

Hereinafter, embodiments of the present invention are described with reference to the drawings. It should be noted that the present invention can be suitably changed without changing essential points thereof.

First Embodiment

Figure 1:
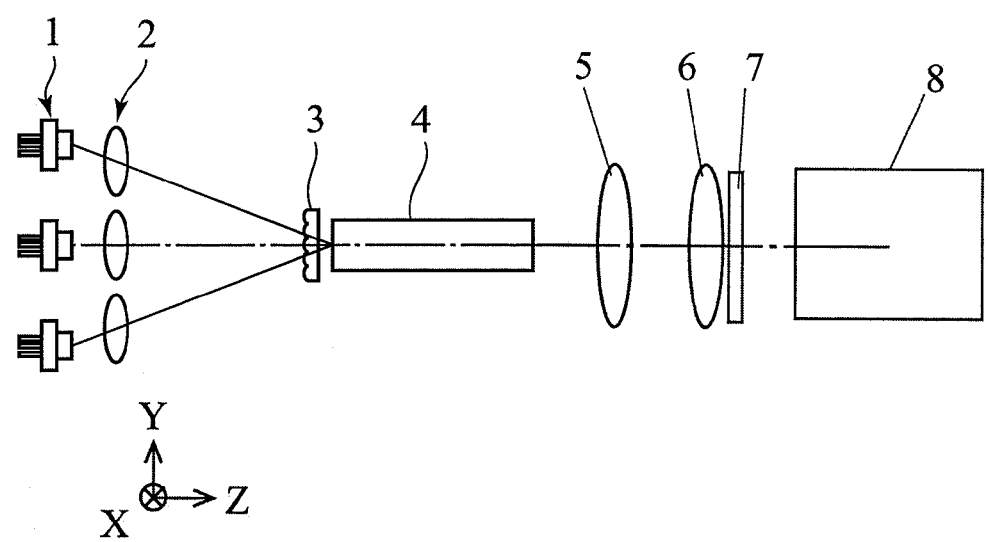
FIG. 1 is a YZ side view of a projection type display device according to a first embodiment of the invention.
Figure 2:
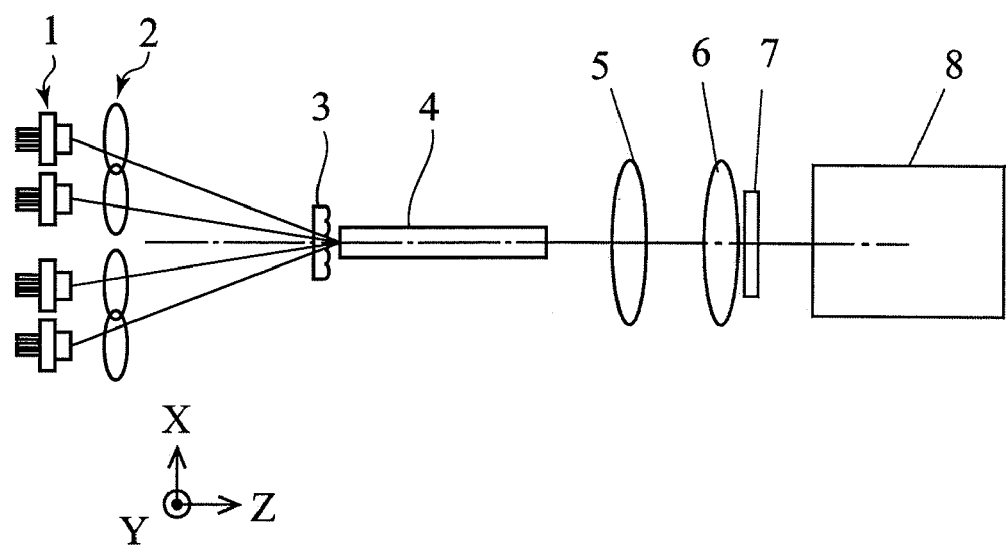
FIG. 2 is an XZ side view of the projection type display device according to the first embodiment of the invention.

FIGS. 1 and 2 are views showing a projection type display device according to a first embodiment of the present invention. X-, Y- and Z-axes are defined as shown in FIGS. 1 and 2. FIG. 1 is a YZ side view of the projection type display device according to the first embodiment of the present invention, and FIG. 2 is an XZ side view of the projection type display device according to the first embodiment of the present invention.

In FIGS. 1 and 2, the projection type display device according to the first embodiment is provided with a laser light source unit 1, a focusing lens unit 2, a lenticular lens 3, a rod integrator 4, a relay lens 5, a field lens 6, a spatial light modulation element 7 and a projection lens 8.

The laser light source unit 1 is comprised of six semiconductor lasers as described later and emits red or blue laser lights. The focusing lens unit 2 is comprised of six lenses as described later and focuses the laser lights emitted from the laser light source unit 1. The lenticular lens 3 is an integral unit of a group of cylindrical lenses arranged in a Y-axis direction and a group of cylindrical lenses arranged in an X-axis direction. The lenticular lens 3 is so held as to rotate about a Z-axis by an unillustrated driving element.

The rod integrator 4 is a rectangular parallelepipedic glass member and homogenizes a light quantity distribution of the incident laser light. An incident surface of the rod integrator 4 has a rectangular shape with longer sides in the Y-axis direction and shorter sides in the X-axis direction. The rod integrator 4 in this embodiment corresponds to an example of a homegenizer. The relay lens 5 and the field lens 6 focus an image on an emergent end surface of the rod integrator 4 on the spatial light modulation element 7. The spatial light modulation element 7 is constructed, for example, by a liquid crystal panel and modulates the image on the emergent end surface of the rod integrator 4. The projection lens 8 projects the image modulated by the spatial light modulation element 7 onto an unillustrated screen.

Figure 3:
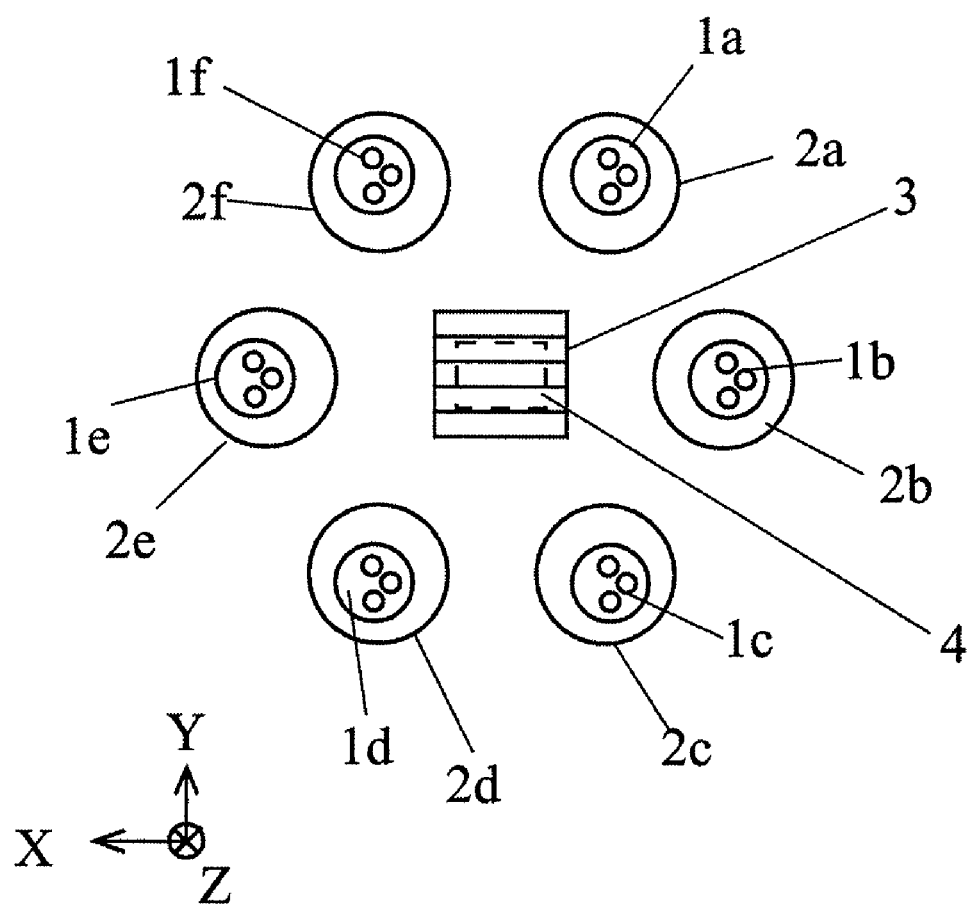
FIG. 3 is an XY side view of the projection type display device according to the first embodiment of the invention.

FIG. 3 is an XY side view of the projection type display device according to the first embodiment of the present invention. In FIG. 3, the construction in the case where the rod integrator 4 is seen from the laser light source unit 1 is shown to avoid cumbersomeness. In FIG. 3, the same parts and elements as those in FIGS. 1 and 2 are not described by being identified by the same reference numerals. In FIG. 3, the laser light source unit 1 includes a plurality of semiconductor lasers 1a to 1f, and the focusing lens unit 2 includes a plurality of focusing lenses 2a to 2f.

The semiconductor lasers 1a to 1f are so arranged as to be symmetrical with respect to an optical axis of the rod integrator 4. Stripe width directions of the respective light emission regions of the semiconductor lasers 1a to 1f are parallel to the longer sides of the rod integrator 4. The relative positions of the semiconductor lasers 1a to 1f and the focusing lenses 2a to 2f are fixed after being adjusted such that laser lights emitted from the semiconductor lasers 1a to 1f are incident on the rod integrator 4 through the lenticular lens 3.

Figure 4:
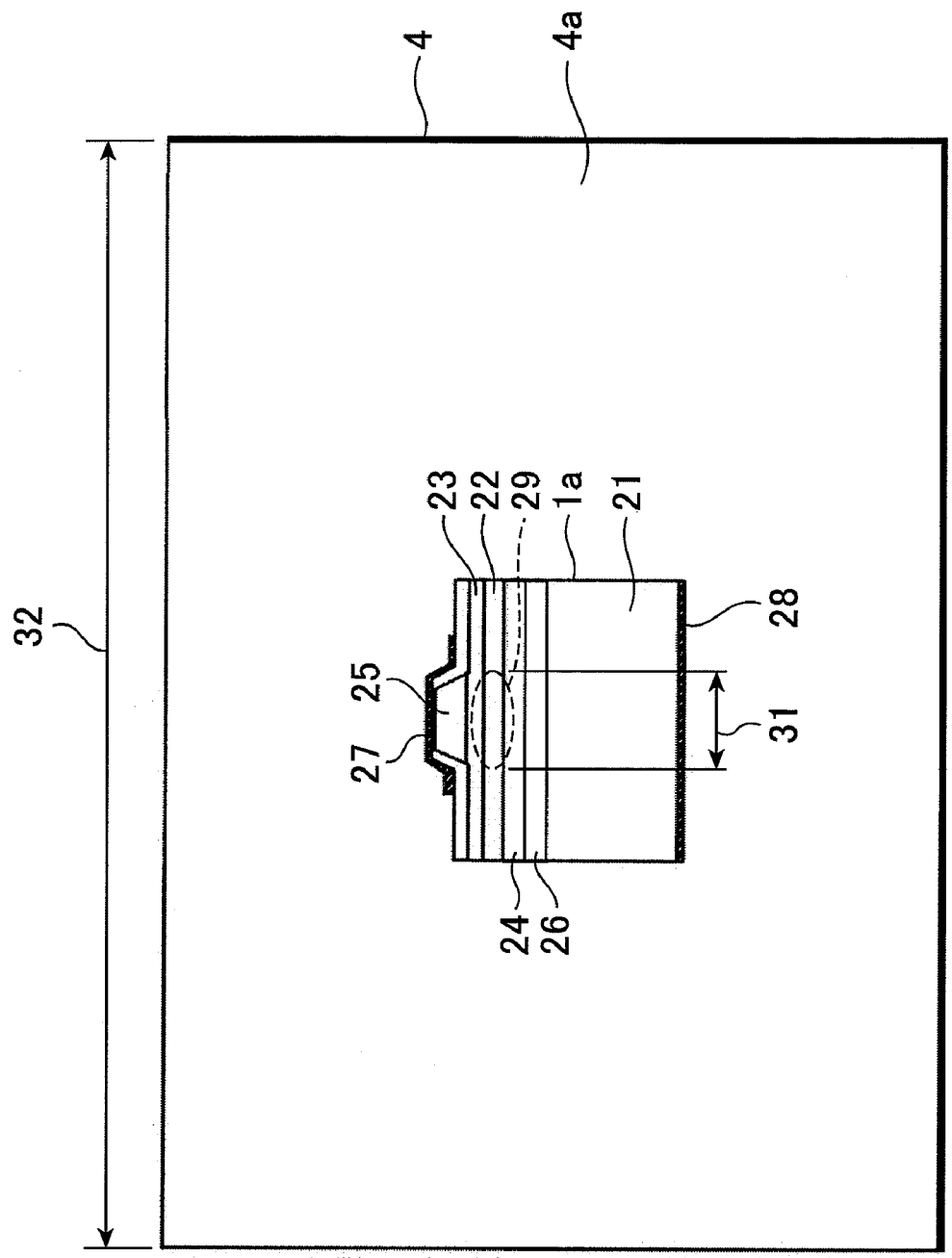
FIG. 4 is a diagram showing an arrangement of a semiconductor laser and a rod integrator.

FIG. 4 is a diagram showing an arrangement of the semiconductor laser and the rod integrator. In FIG. 4, the construction of the semiconductor laser 1a is shown as an example. The constructions of the other semiconductor lasers 1b to 1f are the same as that of the semiconductor laser 1a. In FIG. 4, the semiconductor laser 1a includes a substrate 21, an active layer 22, an upper light guide layer 23, a lower light guide layer 24, a p-clad layer 25, an n-clad layer 26, a p-electrode 27 and an n-electrode 28, the elements 21 to 28 being laminated one over another.

The active layer 22 emits a light of a wavelength corresponding to band gap energy due to the recombination of injected electrons and holes. The upper and lower light guide layers 23, 24 enclose the emitted light in the active layer 22. The p-clad layer 25 and the n-clad layer 26 increase the electron density and hole density of a junction region of the active layer 22. The p-electrode 27 and n-electrode 28 are respectively connected to a positive and a negative electrodes of a power supply.

If a current is injected via the p-electrode 27 and n-electrode 28, a great number of electrons are collected to a p-side from an n-side and a great number of holes are also collected to the n-side from the p-side. The collected electrons and holes are recombined in a region near the p-n combined active layer 22, and stimulated emission of light occurs upon the recombination. The stimulated emission light is enclosed between the upper and lower light guide layers 23, 24, and is repeatedly reflected between the upper and lower light guide layers 23, 24, thereby being emitted as a laser light.

The thickness of the active layer 22 is, for example, 1 μm. A width length of a light emitting part of the active layer 22 is, for example, 7 μm in the case of a blue laser light while being, for example, 150 μm in the case of a red laser light. Accordingly, an elliptical light is emitted from a light emission region 29 of the active layer 22.

Here, an incident surface 4a of the rod integrator 4 has a rectangular shape. The semiconductor laser 1a is arranged such that the longitudinal direction (stripe width direction shown by arrows 31 in FIG. 4) of the light emission region 29 and the longer side direction (direction shown by arrows 32 in FIG. 4) of the incident surface 4a of the rod integrator 4 are parallel.

The operation of the projection type display device according to the first embodiment of the present invention is described with reference to FIGS. 1 to 3. Laser lights emitted from the semiconductor lasers 1a to 1f are focused by the focusing lenses 2a to 2f such that an intersection of the respective focused luminous fluxes is located on the incident surface of the rod integrator 4. At this time, a maximum focused spot can be obtained without the lights incident on the rod integrator 4 being shaded since the stripe width directions of the respective active layers of the semiconductor lasers 1a to 1f and the longer side direction of the rod integrator 4 are parallel. Thus, a light quantity distribution on the emergent end surface of the rod integrator 4 can be homogenized.

The lenticular lens 3 is rotated about the Z-axis by the unillustrated driving element, thereby having a function of temporally changing incident positions and incident angles of the laser lights incident on the rod integrator 4 to homogenize the light quantity distribution on the emergent end surface of the rod integrator 4.

Since laser lights are highly coherent, lights reflected by the unevenness of the screen enter human eyes to interfere, whereby a random interference pattern called speckle noise is formed. However, by driving the lenticular lens 3, the random interference pattern can be averaged to reduce the speckle noise. The lights incident on the rod integrator 4 undergo multiple reflections inside and display a substantially uniform light quantity distribution on the emergent end surface. Further, by arranging the semiconductor lasers 1a to 1f symmetrically with respect to the optical axis of the rod integrator 4, the light quantity distributions of the lights emitted from the respective semiconductor lasers become symmetrical with respect to this optical axis. Therefore, the homogeneity of the light quantity distribution on the emergent end surface can be further improved.

An angle between the outermost one of the lights emerging from the rod integrator 4 and the optical axis of the rod integrator 4 is the sum of an angle between the lights incident on the rod integrator 4 from the semiconductor lasers 1a to 1f and the optical axis of the rod integrator 4 and an angle between the light parallel to the optical axis of the rod integrator 4 and refracted by the lenticular lens 3 and the optical axis and the rod integrator 4. Accordingly, the sum of these angles needs to match the take-in angle of the relay lens 5. The light emerging from the rod integrator 4 is irradiated to the spatial light modulation element 7 by the relay lens 5 and the field lens 6. The spatial light modulation element 7 spatially modulates the irradiated light in accordance with a signal from an unillustrated control circuit. The projection lens 8 forms an image by projecting the spatially modulated light by the spatial light modulation element 7 onto the unillustrated screen.

With such a construction, a maximum focused spot can be obtained without the lights incident on the rod integrator 4 being shaded by arranging the semiconductor lasers 1a to 1f such that the stripe width directions of the respective active layers of the semiconductor lasers 1a to 1f and the longer side direction of the rod integrator 4 are parallel. Thus, the light quantity distribution on the emergent end surface of the rod integrator 4 can be homogenized. Further, by arranging the semiconductor lasers 1a to 1f symmetrically with respect to the optical axis of the rod integrator 4, the light quantity distributions of the lights emitted from the respective semiconductor lasers are symmetrical with each other with respect to the optical axis. Thus, the homogeneity of the light quantity distribution on the emergent end surface of the rod integrator 4 is improved, wherefore a bright and uniform light quantity distribution can be obtained on the screen.

In this embodiment, a hollow light pipe may be used instead of the rod integrator 4. Further, the number of the semiconductor lasers is not limited to six in this embodiment and does not matter as long as the semiconductor lasers are arranged symmetrically with respect to the optical axis of the rod integrator 4.

Figure 5:
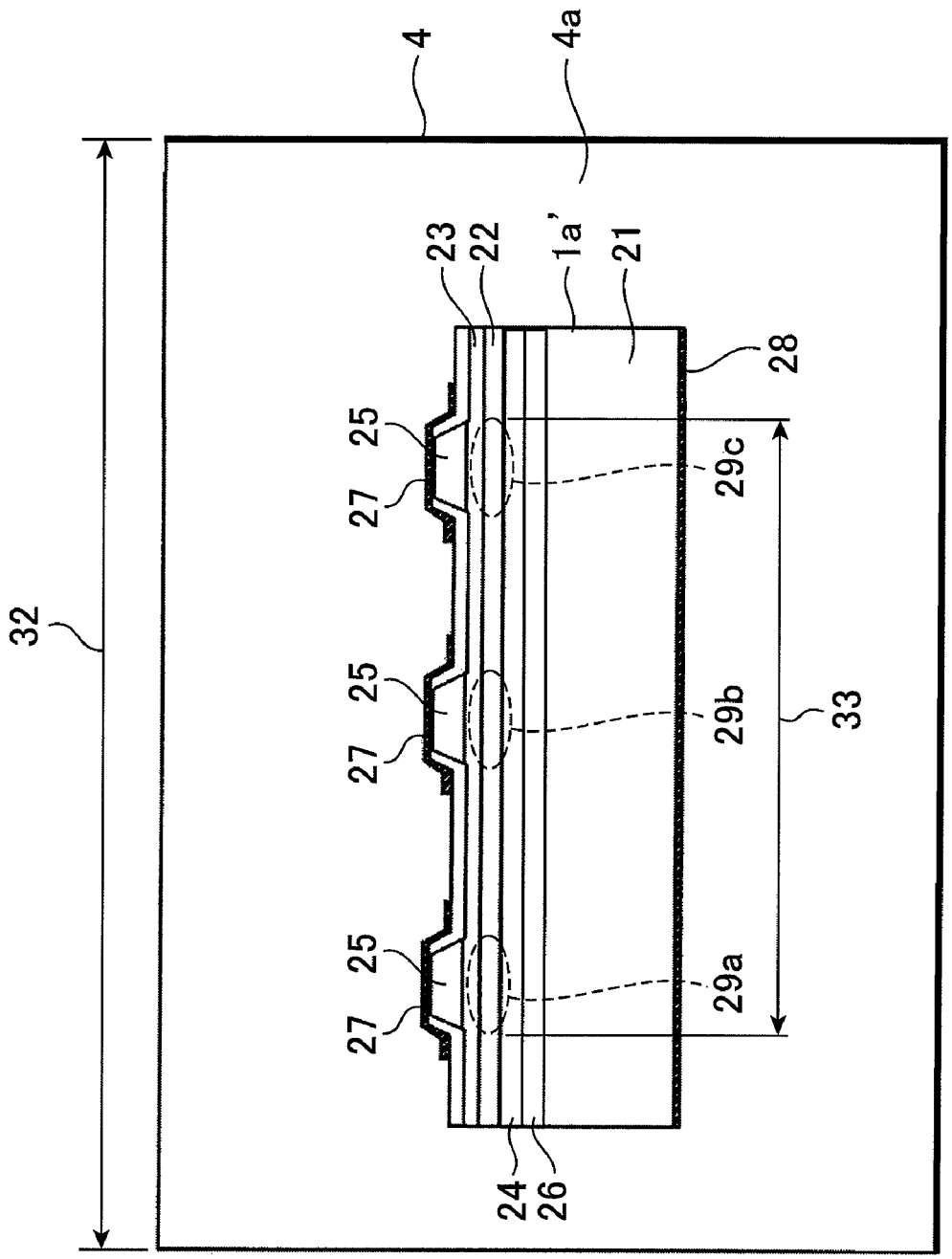
FIG. 5 is a diagram showing an arrangement of a semiconductor laser having a plurality of light emission regions and a rod integrator.

The number of the light emission region of each semiconductor laser 1a to 1f needs not be limited to one per laser chip, and each semiconductor laser may be a multi-emitter semiconductor lasers in which a plurality of light emission regions are arranged along the active layer. FIG. 5 is a diagram showing an arrangement of a semiconductor laser having a plurality of light emission regions and the rod integrator. In FIG. 5, a multi-emitter semiconductor laser 1a' includes a substrate 21, an active layer 22, an upper light guide layer 23, a lower light guide layer 24, p-clad layers 25, an n-clad layer 26, p-electrodes 27 and an n-electrode 28, the elements 21 to 28 being laminated one over another. It should be noted that the same construction of the multi-emitter semiconductor laser 1a' of FIG. 5 as the semiconductor laser 1a shown in FIG. 4 are not described by being identified by the same reference numerals.

The multi-emitter semiconductor laser 1a' has a plurality of light emission regions 29a, 29b and 29c respectively arranged on a straight line along the active layer. Elliptical lights are emitted from the respective light emission regions 29a, 29b and 29c of the active layer 22. Here, the incident surface 4a of the rod integrator 4 has a rectangular shape. The semiconductor laser 1a' is arranged such that an arrangement direction (stripe width direction shown by arrows 33 in FIG. 5) of the plurality of light emission regions 29a, 29b and 29c and the longer side direction (direction shown by arrows 32 in FIG. 5) of the incident surface 4a of the rod integrator 4 are parallel.

Since a maximum focused spot can be obtained without the lights incident on the rod integrator 4 being shaded since the stripe width direction and the longer side direction of the rod integrator 4 are parallel in the multi-emitter semiconductor laser as well, a light quantity distribution on the emergent end surface of the rod integrator 4 can be homogenized.

Although the multi-emitter semiconductor laser 1a' shown in FIG. 5 has three light emission regions, the present invention is not particularly limited thereto and the multi-emitter semiconductor laser 1a' may have two, four or more light emission regions.

Second Embodiment

FIG. 6 is a diagram showing the construction of a projection type display device according to a second embodiment of the present invention. In FIG. 6, the same constituent elements as those in FIGS. 1 and 2 are not described by being identified by the same reference numerals.

In FIG. 6, the projection type display device according to the second embodiment is provided with a laser light source unit 1, a focusing lens unit 2, a lenticular lens 3, a rod integrator 4, a relay lens 5, a field lens 6, a spatial light modulation element 7, a projection lens 8, a convex lens 9 and a concave lens 10. The convex lens 9 and the concave lens 10 constitute a telephoto type optical system, and a parallel light incident on the convex lens 9 is focused to an incident surface of the rod integrator 4. The operation of the projection type display device according to the second embodiment of the present invention is described below with reference to FIG. 6.

The light emission regions of the plurality of semiconductor lasers constituting the laser light source unit 1 are so adjusted as to conform to the foci of the respective lenses constituting the focusing lens unit 2, and lights emitted from the semiconductor lasers are converted into parallel lights parallel to the optical axis of the rod integrator 4 by the focusing lens unit 2. The parallel lights emerging from the focusing lens units are focused by the convex lens 9 and the concave lens 10 and are incident on the incident end surface of the rod integrator 4 through the lenticular lens 3. The succeeding operations are not described since being similar to those of the projection type display device according to the first embodiment.

With such a construction, a distance from the laser light source unit 1 to the rod integrator 4 can be shortened since a distance between the convex lens 9 and the concave lens 10 is shorter than a focal length of the telephoto type lens constituted by the convex lens 9 and the concave lens 10, wherefore the projection type display device can be miniaturized.

Third Embodiment

Figure 7:
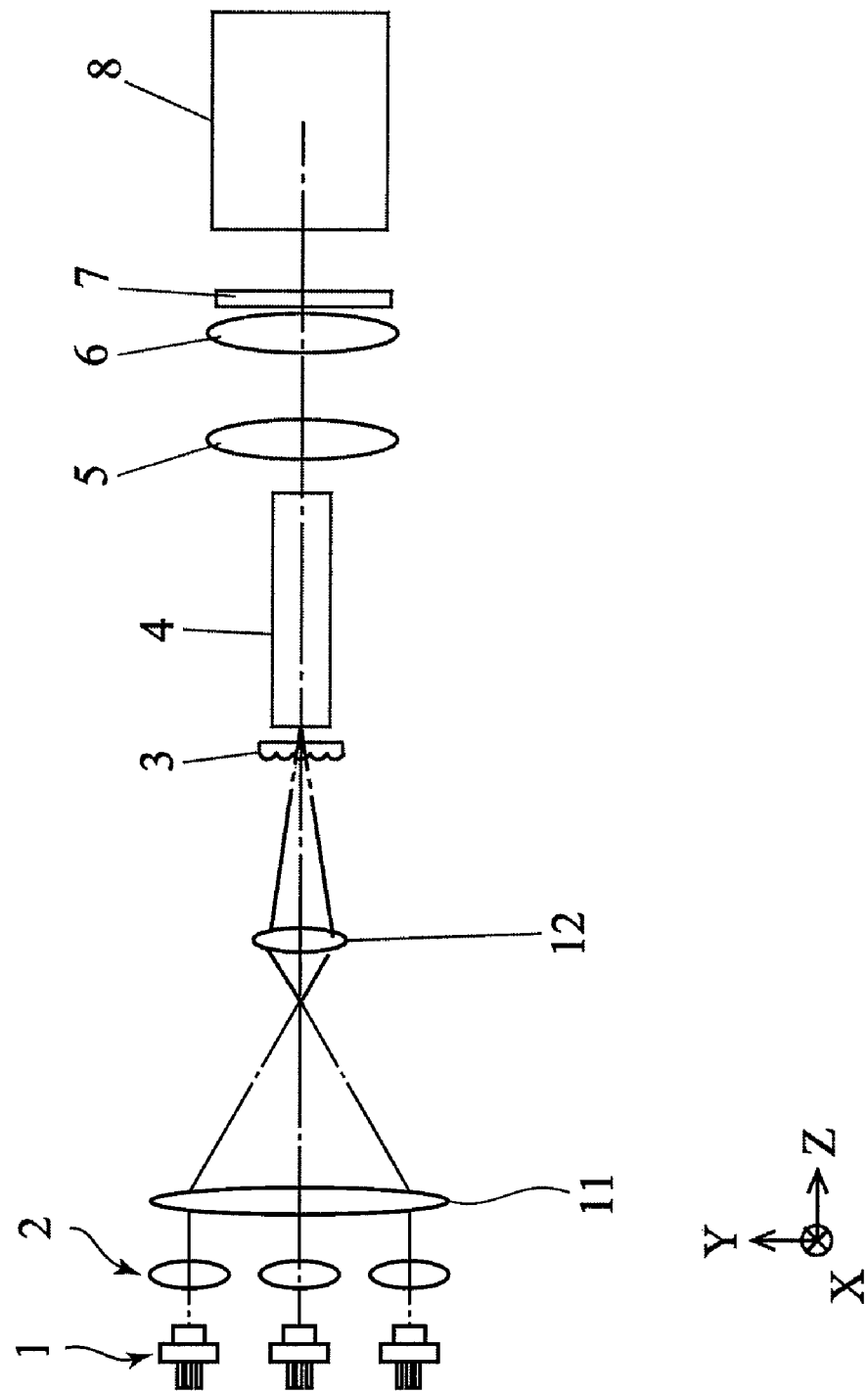
FIG. 7 is a diagram showing the construction of a projection type display device according to a third embodiment of the invention.

FIG. 7 is a diagram showing the construction of a projection type display device according to a third embodiment of the present invention. In FIG. 7, the same constituent elements as those in FIGS. 1 and 2 are not described by being identified by the same reference numerals.

In FIG. 7, the projection type display device according to the third embodiment is provided with a laser light source unit 1, a focusing lens unit 2, a lenticular lens 3, a rod integrator 4, a relay lens 5, a field lens 6, a spatial light modulation element 7, a projection lens 8, a first convex lens 11 and a second convex lens 12. An interval between the first and second convex lenses is set at about the sum of focal lengths of the respective lenses, and lights focused by the first convex lens 11 are focused to an incident end surface of the rod integrator 4 by the second convex lens 12. The first and second convex lenses 11, 12 constitute a telephoto type optical system, and a lens interval can be made shorter as compared with a combined focal length. The operation of the projection type display device according to the third embodiment of the present invention is described below with reference to FIG. 7.

Light emission regions of a plurality of semiconductor lasers constituting the laser light source unit 1 are so adjusted as to conform to the foci of the respective lenses constituting the focusing lens unit 2, and lights emitted from the semiconductor lasers are converted into parallel lights parallel to the optical axis of the rod integrator 4 by the focusing lens unit 2. The parallel lights emerging from the focusing lens unit are focused by the first and second convex lenses 11, 12 and are incident on the incident end surface of the rod integrator 4 through the lenticular lens 3. The succeeding operations are not described since being similar to those of the projection type display device according to the first embodiment.

With such a construction, an interval between the first and second convex lenses 11, 12 can be shorter than the combined focal length of the telephoto type lens constituted by the first and second convex lenses 11, 12. Accordingly, an interval from the laser light source unit 1 to the rod integrator 4 can be made shorter than the combined focal length when the size of the laser light source unit 1, i.e. the aperture diameter of the first convex lens 11 is increased while an angle between the outermost one of the lights incident on the rod integrator 4 and the optical axis of the rod integrator 4 is kept. Therefore, a small-size and high-output projection type display device can be provided.

Fourth Embodiment

Figure 8:
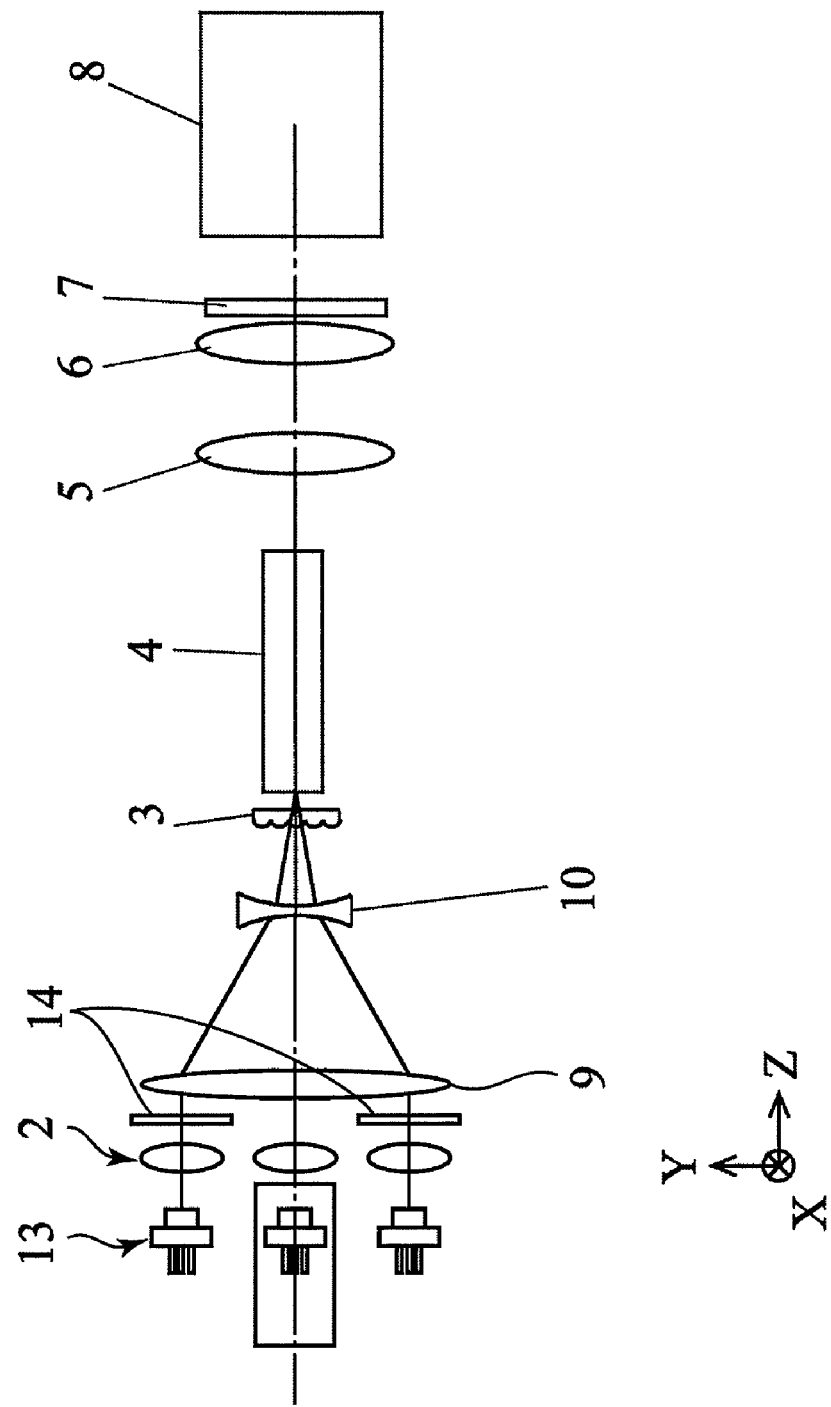
FIG. 8 is a diagram showing the construction of a projection type display device according to a fourth embodiment of the invention.

FIG. 8 is a diagram showing the construction of a projection type display device according to a fourth embodiment of the present invention. In FIG. 8, the same constituent elements as those in FIG. 6 are not described by being identified by the same reference numerals.

In FIG. 8, the projection type display device according to the fourth embodiment is provided with a laser light source unit 13, a focusing lens unit 2, a lenticular lens 3, a rod integrator 4, a relay lens 5, a field lens 6, a spatial light modulation element 7, a projection lens 8, a convex lens 9, a concave lens 10 and a half-wave plate 14.

Figure 9:
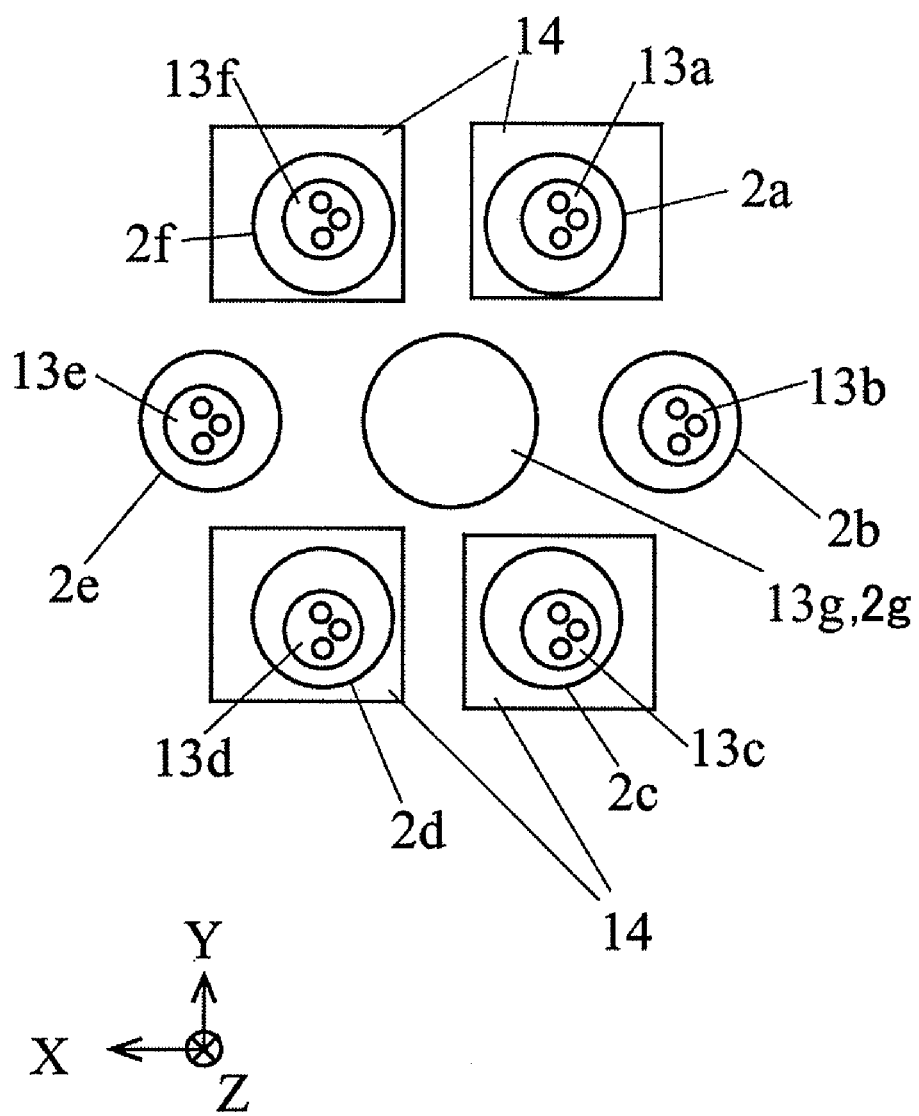
FIG. 9 is an XY side view of a laser light source according to the fourth embodiment of the invention.

The laser light source unit 13 is comprised of laser light sources of three primary colors as described later. The half-wave plate 14 rotates a polarizing surface. FIG. 9 is an XY side view of the laser light source unit 13 shown in FIG. 8. In FIG. 9, the laser light source unit 13 includes red semiconductor lasers 13a, 13c, 13d and 13f, blue semiconductor lasers 13b, 13e and a green laser 13g. The red semiconductor lasers 13a, 13c, 13d and 13f emit red laser lights whose polarizing surfaces are perpendicular to a laminating direction of active layers. The blue semiconductor lasers 13b, 13e emit blue laser lights whose polarizing surfaces are parallel to the laminating direction of the active layers. The green laser 13g emits a green laser light.

The focusing lens unit 2 includes a plurality of focusing lenses 2a to 2g. The focusing lenses 2a, 2c, 2d and 2f focus the respective red laser lights emitted from the red semiconductor lasers 13a, 13c, 13d and 13f to an incident surface of the rod integrator 4. The focusing lenses 2b, 2e focus the respective blue laser lights emitted from the blue semiconductor lasers 13b, 13e to the incident surface of the rod integrator 4. The focusing lens 2g focuses the green laser light emitted from the green semiconductor laser 13g to a position before the incident surface of the rod integrator 4.

Figure 10:
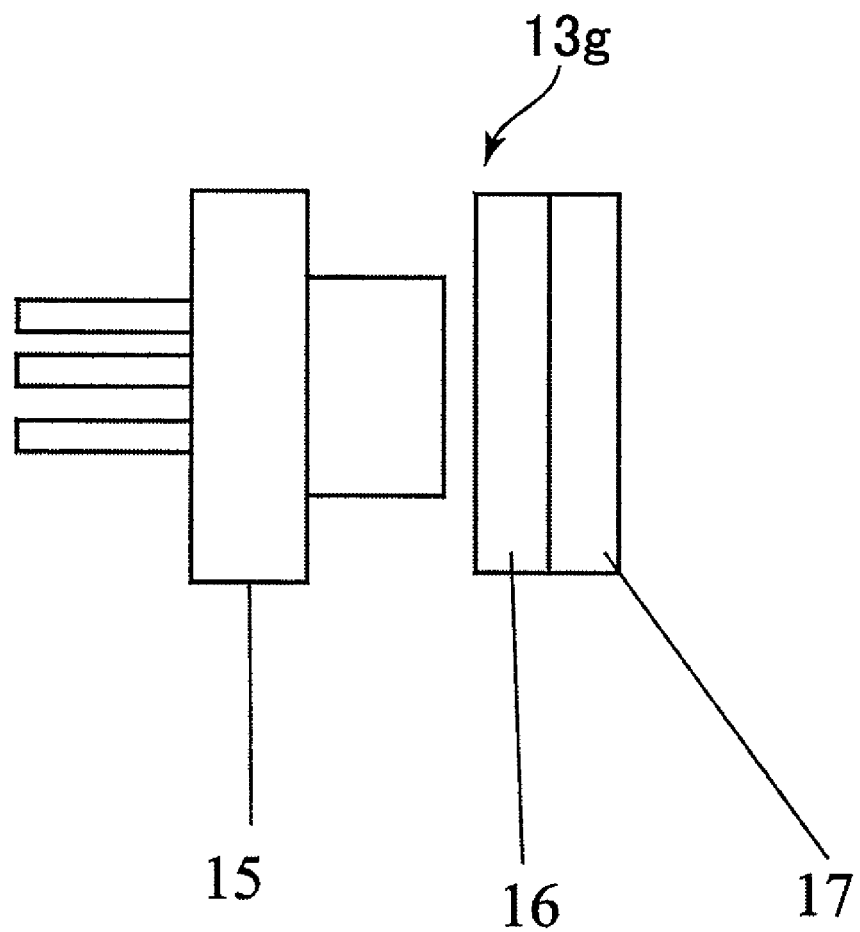
FIG. 10 is a diagram showing the construction of a green laser according to the fourth embodiment of the invention.

FIG. 10 is a diagram showing the construction of the green laser 13g shown in FIG. 9. In FIG. 10, the green laser 13g includes an infrared semiconductor laser 15, a laser medium 16 and a SHG (second harmonic generation) element 17. The infrared semiconductor laser 15 emits an excitation laser light having a wavelength of, e.g. 809 nm. The laser medium 16 is made of, e.g. a YAG crystal. A reflection film for reflecting a light of 1064 nm is formed on a side of the laser medium 16 toward the infrared semiconductor laser 15. On a surface of the SHG element 17 opposite to the laser medium 16 is formed a reflection film for transmitting a light of 523 nm and reflecting a light of 1064 nm. The SHG element 17 is made of, e.g. a KTP crystal or lithium niobate crystal. In this embodiment, the infrared semiconductor laser 15 corresponds to an example of a semiconductor laser light source for excitation and the SHG element 17 corresponds to an example of a wavelength conversion element.

When the laser medium 16 is excited by a laser light emitted from the infrared semiconductor laser 15, a laser light of 1064 nm is emitted. A second harmonic is generated while this laser light makes a round trip between the laser medium 16 and the SHG element 17 as a fundamental wave, and a green laser light of 532 nm is emitted from the SHG element 17. The laser light emitted from the green laser 13g differs from laser lights emitted from the semiconductor lasers 13a to 13f and is substantially a parallel light. In FIG. 9, the polarizing surface of the green laser 13g is arranged to be parallel to the Y-axis. The other semiconductor lasers 13a to 13f are arranged such that the stripe width directions of the active layers are parallel to the X-axis. Accordingly, the polarizing surfaces of the red semiconductor lasers 13a, 13c, 13d and 13f are parallel to the X-axis, and those of the blue semiconductor lasers 13b, 13e are parallel to the Y-axis.

In FIG. 8, the laser lights emitted from the semiconductor lasers 13a to 13f of the laser light source unit 13 are converted into parallel lights by the focusing lens unit 2 and are incident on the incident end surface of the rod integrator 4 via the convex lens 9 and the concave lens 10 together with the green laser light, which is originally a parallel light. The polarizing surfaces of the laser lights emitted from the red semiconductor lasers 13a, 13c, 13d and 13f of the laser light source unit 13 are originally parallel to the X-axis, but are so rotated as to be parallel to the Y-axis upon passing through the half-wave plate 14. Accordingly, the polarizing surfaces of the laser lights incident on the rod integrator 4 are all parallel to the Y-axis. The succeeding operations are not described since being similar to those of the projection type display device according to the first embodiment.

If the focal point of the green laser light is set on the incident surface of the rod integrator 4 as the focal points of the red and blue laser lights are in the fourth embodiment, the green laser light directly emerges from the rod integrator 4 without being reflected therein since the green laser 13g is arranged on the optical axis of the rod integrator 4, wherefore there is a likelihood that the light quantity distribution of the green laser light is not homogenized. Accordingly, in the fourth embodiment, the green laser light is focused before being incident on the rod integrator 4, and the laser light source unit 13, the focusing lens unit 2, the convex lens 9 and the concave lens 10 are arranged such that an angle between the optical axis of the rod integrator 4 and the outermost edge of the green laser light at the focal point where the green laser light is focused is equal to an angle between the optical axis of the rod integrator 4 and the red or blue laser lights at the focal point where the red laser lights or blue laser lights are focused.

Figure 11:
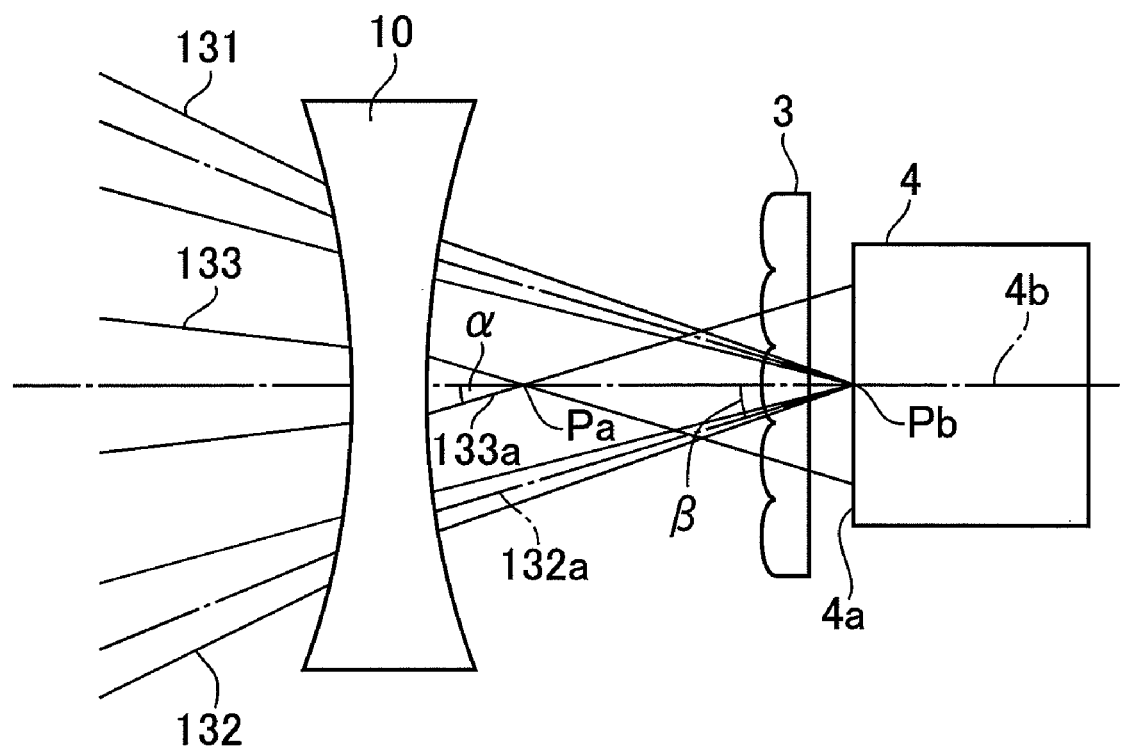
FIG. 11 is a diagram showing laser lights of the respective colors incident on a rod integrator in the fourth embodiment.
Figure 12:
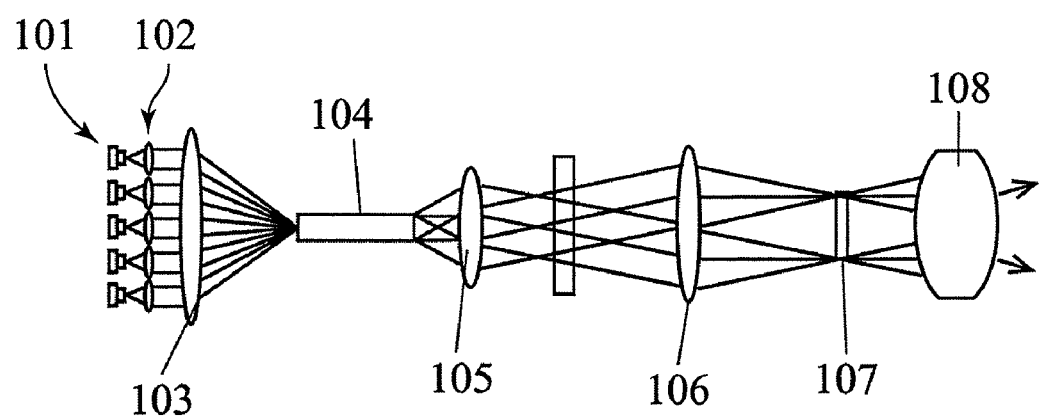
FIG. 12 is a diagram showing the construction of a conventional projection type display device.
Figure 13:
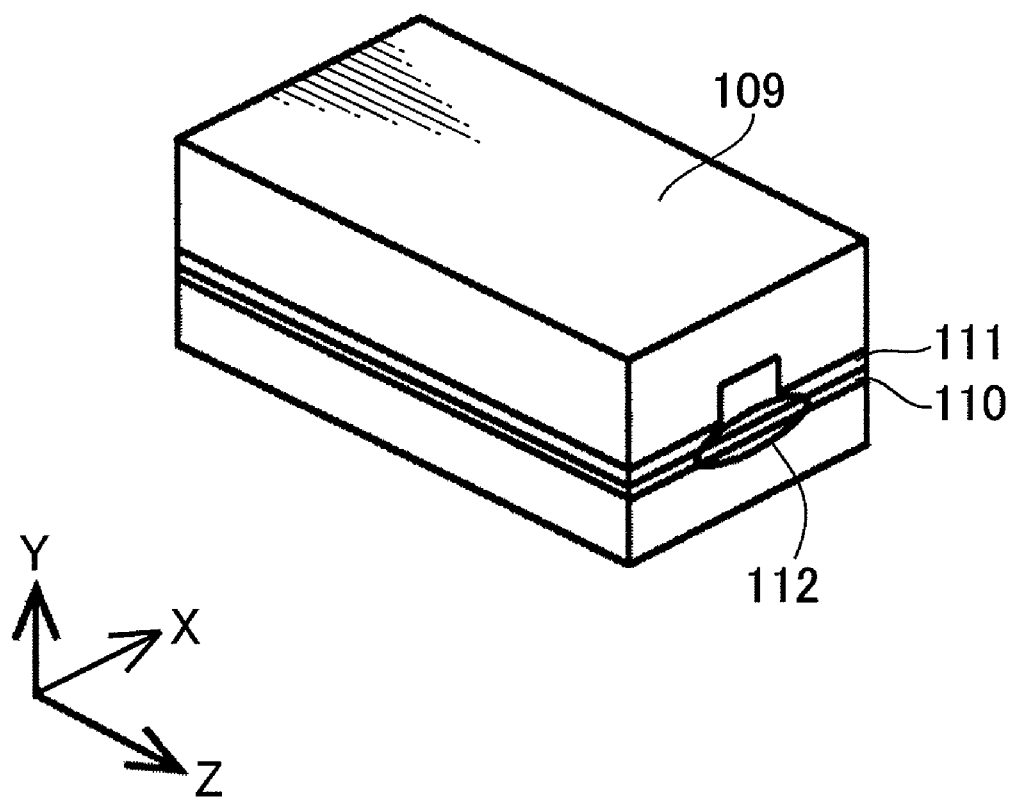
FIG. 13 is a perspective view showing the construction of a conventional semiconductor laser.
Figure 14:
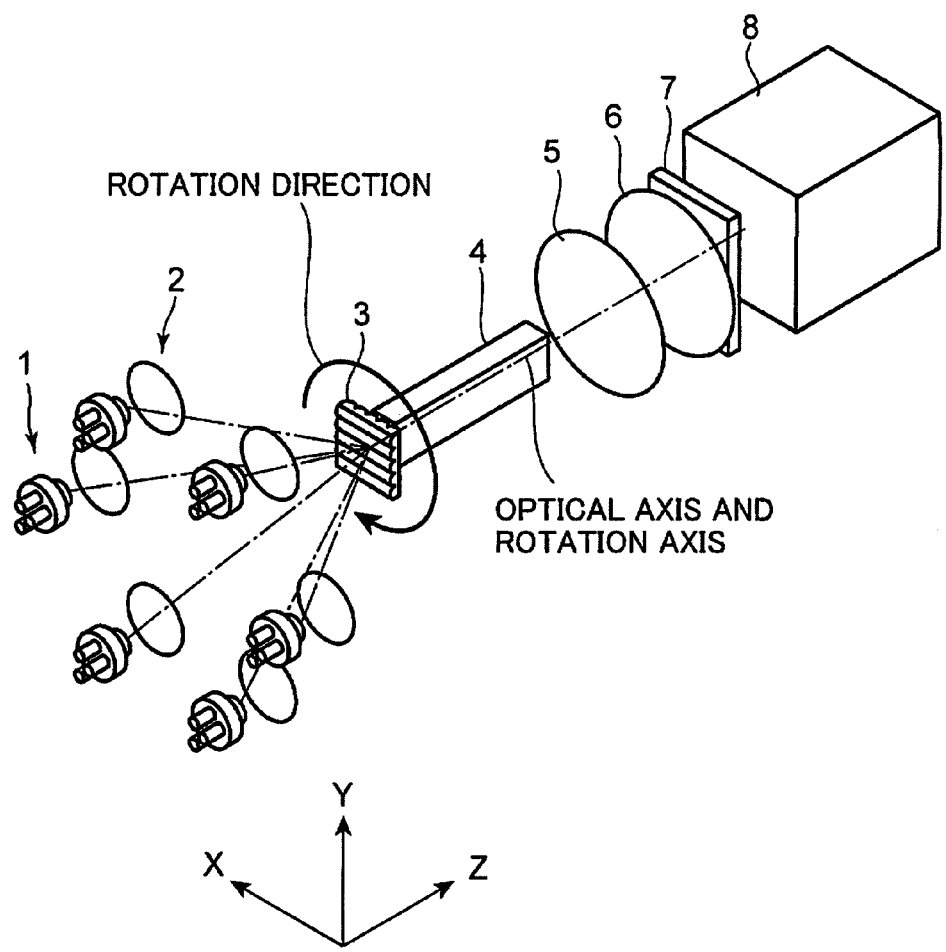
FIG. 14 is a diagram showing an example wherein the optical axis and the rotation axis of the lenticular lens coincide with each other.
Figure 15:
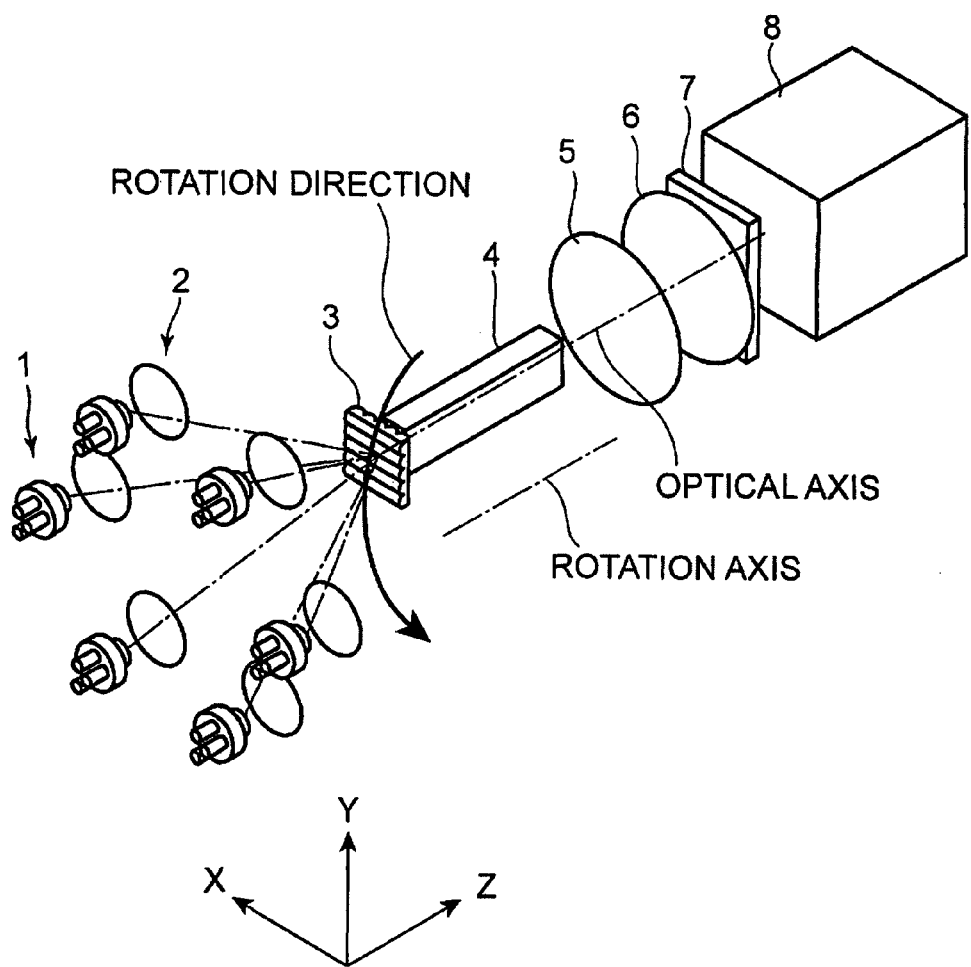
FIG. 15 is a diagram showing an example wherein the optical axis and the rotation axis of the lenticular lens do not coincide with each other and wherein the rotation axis of the lenticular lens is parallel to the optical axis.

FIG. 11 is a diagram showing the laser lights of the respective colors incident on the rod integrator 4. A red laser light 131 emitted from the red semiconductor laser 13a is focused on the incident surface 4a of the rod integrator 4 by the focusing lens 2a, and a red laser light 132 emitted from the red semiconductor laser 13c is focused on the incident surface 4a of the rod integrator 4 by the focusing lens 2c. On the other hand, a green laser light 133 emitted from the green laser 13g is focused by the focusing lens 2g before being incident on the rod integrator 4. A focal point Pa of the green laser light 133 is present between the concave lens 10 and the lenticular lens 3.

Here, an angle α between an optical axis 4b of the rod integrator 4 and an outermost edge 133a of the green laser light 133 at the focal point Pa of the focusing lens 2g for green is equal to an angle β between the optical axis 4b of the rod integrator 4 and an optical axis 132a of the red laser light 132 at a focal point Pb of the focusing lens 2c for red.

In this way, the green laser light is incident at a specified angle to the incident surface of the rod integrator 4 even if the green laser 13g is arranged on the optical axis of the rod integrator 4. Thus, the light quantity distribution of the green laser light can be homogenized approximately to the same extent as those of the red and blue laser lights, wherefore the occurrence of color nonuniformity can be suppressed.

With such a construction, a full color image is displayed if filters of three primary colors are attached to the respective pixels of the spatial light modulation element 7 since the spatial light modulation element 7 is irradiated with illumination lights of three primary colors. Alternatively, a full color image is similarly displayed if the respective laser elements constituting the laser light source unit 13 are pulse-driven according to colors and the spatial light modulation element 7 is synchronously driven in a time sharing manner according to colors. By matching the polarizing surfaces of the laser lights of three primary colors when the stripe width directions of the active layers and the longer side direction of the rod integrator 4 are aligned, the polarizing surfaces of the laser lights incident on the spatial light modulation element 7 can be made unidirectional. As a result, if the spatial light modulation element 7 is a liquid crystal panel, the polarizing surfaces of the incident-side polarizers can be more easily aligned to improve light utilization efficiency. Even if the spatial light modulation element 7 is a micromirror array, it can be so constructed as to utilize S-polarized lights with high reflectances for all the three primary colors, wherefore light utilization efficiency can be improved.

Although the polarizing surfaces of the red semiconductor lasers and those of the blue semiconductor lasers differ from each other by 90° with respect to the active layers in this embodiment, the present invention is not particularly limited to this. If both red and blue semiconductor lasers have polarizing surfaces parallel to the active layers, the half-wave plate is unnecessary. By using a wave plate that functions as a half-wave plate in response to the wavelength of the blue laser lights and functions as a one-wave plate in response to the wavelength of the green and red laser lights, the number of members can be reduced by disposing the wave plate in a place such as before and after the rod integrator 4 where the luminous fluxes are small.

Although all the semiconductor lasers 13a to 13f are arranged such that the stripe width directions of the active layers are parallel to the longer side direction of the rod integrator 4 in this embodiment, the present invention is not particularly limited thereto and the blue semiconductor lasers 13b, 13e may not be arranged such that the stripe width directions of the active layers are parallel to the longer side direction of the rod integrator 4. As described above, the light emission regions of the blue semiconductor lasers 13b, 13e are, for example, 1 μm in a shorter axis direction (thickness of the active layers) and 7 μm in a longer axis direction (width of the emitting active layers), and an aspect ratio of the light emission regions is smaller as compared with the red laser lights. Thus, even if the blue semiconductor lasers 13b, 13e are arranged such that the stripe width directions of the active layers are perpendicular to the longer side direction of the rod integrator 4, the length of the laser lights on the incident surface of the rod integrator 4 in the longer axis direction is shorter than the length of the shorter sides of the rod integrator 4 and the laser lights are incident on the incident surface of the rod integrator 4 without being shaded. Thus, the red semiconductor lasers 13a, 13c, 13d and 13f may be arranged such that the stripe width directions of the active layers are parallel to the X-axis and the blue semiconductor lasers 13b, 13e may be arranged such that the stripe width directions of the active layers are perpendicular to the X-axis.

As described above, if the lengths of the laser lights in the longer axis direction on the incident surface of the rod integrator 4 are longer than the length of the shorter sides of the rod integrator 4, the red semiconductor lasers 13a, 13c, 13d and 13f are arranged such that the longer axis direction of the light emission regions and the longer side direction of the incident surface of the rod integrator 4 are parallel, wherefore the laser lights emitted from the red semiconductor lasers 13a, 13c, 13d and 13f can be efficiently introduced to the rod integrator 4. Further, if the lengths of the laser lights in the longer axis direction on the incident surface of the rod integrator 4 are shorter than the length of the shorter sides of the rod integrator 4, the laser lights are introduced to the rod integrator 4 without being shaded even if the longer axis direction of the light emission regions and the longer side direction of the incident surface of the rod integrator 4 are not made parallel. Thus, if the lengths of the laser lights in the longer axis direction on the incident surface of the rod integrator 4 are shorter than the length of the shorter sides of the rod integrator 4, it is not necessary to set the longer axis direction of the light emission regions of the blue semiconductor lasers 13b, 13e and the longer side direction of the incident surface of the rod integrator 4 parallel to each other, wherefore the blue semiconductor lasers 13b, 13e and the rod integrator 4 can be freely arranged.

The above specific embodiments mainly embrace inventions having the following constructions.

A projection type display device according to one aspect of the present invention comprises a laser light source unit having a light emission region for emitting an elliptical laser light; a focusing lens unit for focusing the laser light emitted from the laser light source unit; a homogenizer having a rectangular incident surface on luminous flux focused by the focusing lens unit; a spatial light modulation element for modulating the laser light emitted from the homogenizer; and a projection lens for projecting the laser light modulated by the spatial light modulation element, wherein the incident surface of the homogenizer has a rectangular shape and the laser light source unit is arranged such that a longer axis direction of the light emission region and a longer side direction of the incident surface of the homogenizer are parallel.

With this construction, the laser light source unit has the light emission region for emitting an elliptical laser light, and the laser light emitted from the laser light source unit is focused by the focusing lens unit. The homogenizer is so arranged as to locate the rectangular incident surface on the luminous flux focused by the focusing lens unit, the laser light emitted from the homogenizer is modulated by the spatial light modulation element and the laser light modulated by the spatial light modulation element is projected by the projection lens. The incident surface of the homogenizer has a rectangular shape and the laser light source unit is arranged such that the longer axis direction of the light emission region and the longer side direction of the incident surface of the homogenizer are parallel.

Since the laser light source unit is arranged such that the longer axis direction of the light emission region and the longer side direction of the incident surface of the homogenizer are parallel, the laser light emitted from the laser light source unit can be efficiently introduced to the homogenizer and the arrangement of the laser light source unit and the homogenizer is optimized, wherefore miniaturization can be realized and high-output lights can be obtained from the homogenizer.

In the above projection type display device, it is preferable that the laser light source unit includes a plurality of semiconductor laser light sources; that the focusing lens unit includes a plurality of focusing lenses provided in a one-to-one correspondence with the plurality of semiconductor laser light sources for focusing laser lights emitted from the plurality of semiconductor laser light sources on one point; and that the homogenizer has the rectangular incident surface on a focal point of a plurality of laser lights.

With this construction, the laser light source unit includes the plurality of semiconductor laser light sources, the laser lights emitted from the plurality of semiconductor laser light sources are focused on one point by the plurality of focusing lenses provided in a one-to-one correspondence with the plurality of semiconductor laser light sources, and the homogenizer having the rectangular incident surface is arranged on the focal point of the plurality of laser lights. Since the laser lights emitted from the plurality of semiconductor lasers are focused on the incident surface of the homogenizer, high-output lights can be obtained from an emergent surface of the homogenizer.

In the above projection type display device, the plurality of semiconductor laser light sources are preferably arranged symmetrically with respect to an optical axis of the homogenizer. With this construction, the light quantity distribution of the lights emitted from the respective semiconductor lasers become symmetrical with respect to the optical axis since the plurality of semiconductor laser light sources are arranged symmetrically with respect to the optical axis of the homogenizer. Therefore, the homogeneity of the light quantity distribution on the emergent end surface of the homogenizer can be improved.

In the above projection type display device, it is preferable that the laser light source unit includes a plurality of semiconductor laser light sources; that the focusing lens unit includes a plurality of collimator lenses provided in a one-to-one correspondence with the plurality of semiconductor laser light sources for collimating laser lights emitted from the plurality of semiconductor laser light sources, a convex lens for focusing the laser lights collimated by the condenser lenses and a concave lens disposed between the convex lens and a focal point of the convex lens; and that the homogenizer has the rectangular incident surface on a focal point of a combined lens comprised of the convex lens and the concave lens.

With this construction, the laser lights emitted from the plurality of semiconductor laser light sources are collimated by the plurality of collimator lenses provided in a one-to-one correspondence with the plurality of semiconductor laser light sources, and the collimated laser lights are focused by the convex lens. The concave lens is disposed between the convex lens and the focal point of the convex lens, and the rectangular incident surface of the homogenizer is arranged at the focal point of the combined lens comprised of the convex lens and the concave lens.

Accordingly, an interval between the convex lens and the concave lens is shorter than the focal length of the telephoto type combined lens comprised of the convex lens and the concave length. Thus, distances from the respective semiconductor laser light sources to the homogenizer can be shortened to realize the miniaturization of the device.

In the above projection type display device, it is preferable that the laser light source unit includes a red laser light source for emitting a red laser light, a blue laser light source for emitting a blue laser light and a green laser light source for emitting a green laser light; and that the red and blue laser light sources are arranged symmetrically with respect to the optical axis of the homogenizer; and that the green laser light source is arranged on the optical axis of the homogenizer.

With this construction, the red laser light source for emitting a red laser light and the blue laser light source for emitting a blue laser light are arranged symmetrically with respect to the optical axis of the homogenizer, and the green laser light source for emitting a green laser light is arranged on the optical axis of the homogenizer. Thus, the spatial light modulation element is irradiated with illumination lights of three primary colors, wherefore a full color image can be displayed.

In the above projection type display device, it is preferable that the plurality of focusing lenses include a focusing lens for red for focusing a red laser light emitted from the red laser light source on one point, a focusing lens for blue for focusing a blue laser light emitted from the blue laser light source on one point and a focusing lens for green for focusing a green laser light emitted from the green laser light before being incident on the homogenizer; and that an angle between the optical axis of the homogenizer and the outermost edge of the green laser light at the focal point of the focusing lens for green is equal to an angle between the optical axis of the homogenizer and the red or blue laser light at the focal point of the focusing lens for red or the focusing lens for blue.

With this construction, the red laser light emitted from the red laser light source is focused on one point by the focusing lens for red, the blue laser light emitted from the blue laser light source is focused on one point by the focusing lens for blue and the green laser light emitted from the green laser light source is focused before being incident on the homogenizer. The angle between the optical axis of the homogenizer and the outermost edge of the green laser light at the focal point of the focusing lens for green is equal to the angle between the optical axis of the homogenizer and the red or blue laser light at the focal point of the focusing lens for red or blue.

Accordingly, even if the green laser light source is arranged on the optical axis of the homogenizer, the green laser light is incident at a specified angle to the incident surface of the homogenizer. Thus, the light quantity distribution of the green laser light can be homogenized approximately to the same extent as those of the red and blue laser lights, wherefore the occurrence of color nonuniformity can be suppressed.

In the above projection type display device, it is preferable that the red and blue laser light sources include semiconductor laser light sources; and that the green laser light source includes a semiconductor laser light source for excitation for emitting an excitation laser light, a laser medium to be excited by a laser light emitted from the semiconductor laser light source for excitation and a wavelength conversion element for emitting the green laser light by converting the wavelength of the laser light emitted from the laser medium.

With this construction, the red and blue laser lights are emitted from the semiconductor laser light sources. The excitation laser light is emitted from the semiconductor laser light source for excitation, the laser medium is excited by the laser light emitted from the semiconductor laser light source for excitation and the wavelength of the laser light emitted from the laser medium is converted by the wavelength conversion element to emit the green laser light. Accordingly, the green laser light source having a more complicated construction than the red and blue laser light sources as semiconductor lasers is arranged on the optical axis of the homogenizer. Therefore, the miniaturization of the device can be realized.

In the above projection type display device, the plurality of semiconductor laser light sources preferably include a red semiconductor laser light source for emitting a red laser light and a blue semiconductor laser light source for emitting a blue laser light. With this construction, red and blue lights can be obtained from the homogenizer since the red laser light is emitted from the red semiconductor laser light source and the blue laser light is emitted from the blue semiconductor laser light source.

In the above projection type display device, it is preferable that the red semiconductor laser light source and the blue semiconductor laser light source are arranged such that the polarizing surfaces differ, and that a half-wave plate is arranged on either one of an optical path of the laser light emitted from the red semiconductor laser light source until reaching the homogenizer and an optical path of the laser light emitted from the blue semiconductor laser light source until reaching the homogenizer to align the polarizing surfaces of the respective semiconductor laser light sources.

With this construction, the red semiconductor laser light source and the blue semiconductor laser light source are arranged such that the polarizing surfaces differ. The half-wave plate for aligning the polarizing surfaces of the respective semiconductor laser light sources is arranged on either one of the optical path of the laser light emitted from the red semiconductor laser light source until reaching the homogenizer and the optical path of the laser light emitted from the blue semiconductor laser light source until reaching the homogenizer.

Accordingly, the polarizing surface of the laser light emitted from the red semiconductor laser light source and that of the laser light emitted from the blue semiconductor laser light source are aligned. Thus, the polarizing surfaces of the laser lights incident on the spatial light modulation element can be made unidirectional and the polarizing surface of an incident-side polarizer of the spatial light modulation element can be more easily aligned, wherefore light utilization efficiency can be improved.

In the above projection type display device, it is preferable that the laser light source unit includes a semiconductor laser light source having a plurality of light emission regions respectively arranged on a straight line; and that the semiconductor laser light source is arranged such that an arrangement direction of the plurality of light emission regions and a longer side direction of the incident surface of the homogenizer are parallel.

With this construction, the semiconductor laser light source having the plurality of light emission regions respectively arranged on the straight line is arranged such that the arrangement direction of the plurality of light emission regions and the longer side direction of the incident surface of the homogenizer are parallel. Accordingly, even the semiconductor laser light source whose plurality of light emission regions are arranged on the straight line is arranged such that the arrangement direction of the plurality of light emission regions and the longer side direction of the incident surface of the homogenizer are parallel. Therefore, a maximum focused spot can be obtained without the laser lights incident on the homogenizer being shaded.

In the above projection type display device, the laser light source unit is preferably arranged such that the longer axis direction of the light emission regions and the longer side direction of the incident surface of the homogenizer are parallel if the length of the laser light in the longer axis on the incident surface of the homogenizer is longer than that of the shorter sides of the homogenizer.

With this construction, the laser light source unit is arranged such that the longer axis direction of the light emission regions and the longer side direction of the incident surface of the homogenizer are parallel if the length of the laser light in the longer axis on the incident surface of the homogenizer is longer than that of the shorter sides of the homogenizer. Thus, the laser light emitted from the laser light source unit can be efficiently introduced to the homogenizer. Further, if the length of the laser light in the longer axis on the incident surface of the homogenizer is shorter than that of the shorter sides of the homogenizer, the laser light is introduced to the homogenizer without being shaded even if the longer axis direction of the light emission regions and the longer side direction of the incident surface of the homogenizer are not made parallel. Thus, if the length of the laser light in the longer axis on the incident surface of the homogenizer is shorter than that of the shorter sides of the homogenizer, it may not be necessary to set the longer axis direction of the light emission regions and the longer side direction of the incident surface of the homogenizer parallel, wherefore the laser light source unit and the homogenizer can be freely arranged.

In the above projection type display device, it is preferable that the laser light source unit includes a semiconductor laser light source having a plurality of light emission regions respectively arranged on a straight line; and that the semiconductor laser light source is arranged such that an arrangement direction of the plurality of light emission regions and a longer side direction of the incident surface of the homogenizer are parallel.

With this construction, the semiconductor laser light source having the plurality of light emission regions respectively arranged on the straight line is arranged such that the arrangement direction of the plurality of light emission regions and the longer side direction of the incident surface of the homogenizer are parallel. Accordingly, even the semiconductor laser light source whose plurality of light emission regions are arranged on the straight line is arranged such that the arrangement direction of the plurality of light emission regions and the longer side direction of the incident surface of the homogenizer are parallel. Therefore, a maximum focused spot can be obtained without the laser lights incident on the homogenizer being shaded.

In the above projection type display device, it is preferable that the laser light source unit includes a plurality of semiconductor laser light sources; that the focusing lens unit includes a plurality of collimator lenses provided in a one-to-one correspondence with the plurality of semiconductor laser light sources for collimating laser lights emitted from the plurality of semiconductor laser light sources, a convex lens for focusing the laser lights collimated by the collimator lenses and a concave lens disposed between the convex lens and a focal point of the convex lens; and that the homogenizer has a rectangular incident surface at a focal point of a combined lens comprised of the convex lens and the concave lens.

With this construction, the laser lights emitted from the plurality of semiconductor laser light sources are collimated by the plurality of collimator lenses provided in a one-to-one correspondence with the plurality of semiconductor laser light sources, and the collimated laser lights are focused by the convex lens. The concave lens is disposed between the convex lens and the focal point of the convex lens, and the homogenizer having the rectangular incident surface is arranged at the focal point of the combined lens comprised of the convex lens and the concave lens.

Accordingly, an interval between the convex lens and the concave lens is shorter than the focal length of the telephoto type combined lens comprised of the convex lens and the concave length. Thus, distances from the respective semiconductor laser light sources to the homogenizer can be shortened to realize the miniaturization of the device.

In the above projection type display device, it is preferable that the laser light source unit includes a plurality of semiconductor laser light sources; that the focusing lens unit includes a plurality of collimator lenses provided in a one-to-one correspondence with the plurality of semiconductor laser light sources for collimating laser lights emitted from the plurality of semiconductor laser light sources, a first convex lens for focusing the laser lights collimated by the collimator lenses and a second convex lens disposed at a side of a focal point of the first convex lens opposite to the first convex lens for relaying the focused laser lights; and that the homogenizer has a rectangular incident surface at a focal point of the second convex lens.

With this construction, the laser lights emitted from the plurality of semiconductor laser light sources are collimated by the plurality of collimator lenses provided in a one-to-one correspondence with the plurality of semiconductor laser light sources, and the collimated laser lights are focused by the first convex lens. The laser lights focused by the first convex lens are relayed by the second convex lens disposed at the side of the focal point of the first convex lens opposite to the first convex lens, and the homogenizer having the rectangular incident surface is arranged at the focal point of the second convex lens.

Accordingly, an interval between the first convex lens and the second convex lens is shorter than a combined focal length of a telephoto type combined lens comprised of the first convex lens and the second convex length. Thus, the sizes of the semiconductor laser light sources, i.e. the aperture diameters of the focusing lenses can be increased while an angle between the outermost light incident on the homogenizer and the optical axis of the homogenizer is kept, wherefore high-output lights can be obtained from the homogenizer.

In the above projection type display device, the plurality of semiconductor laser light sources preferably include a red semiconductor laser light source for emitting a red laser light and a blue semiconductor laser light source for emitting a blue laser light. With this construction, red and blue lights can be obtained from the homogenizer since the red laser light is emitted from the red semiconductor laser light source and the blue laser light is emitted from the blue semiconductor laser light source.

In the above projection type display device, it is preferable that the red semiconductor laser light source and the blue semiconductor laser light source are arranged such that the polarizing surfaces differ, and that a half-wave plate is arranged on either one of an optical path of the laser light emitted from the red semiconductor laser light source until reaching the homogenizer and an optical path of the laser light emitted from the blue semiconductor laser light source until reaching the homogenizer to align the polarizing surfaces of the respective semiconductor laser light sources.

With this construction, the red semiconductor laser light source and the blue semiconductor laser light source are arranged such that the polarizing surfaces differ. The half-wave plate for aligning the polarizing surfaces of the respective semiconductor laser light sources is arranged on either one of the optical path of the laser light emitted from the red semiconductor laser light source until reaching the homogenizer and the optical path of the laser light emitted from the blue semiconductor laser light source until reaching the homogenizer.

Accordingly, the polarizing surface of the laser light emitted from the red semiconductor laser light source and that of the laser light emitted from the blue semiconductor laser light source are aligned. Thus, the polarizing surfaces of the laser lights incident on the spatial light modulation element can be made unidirectional and the polarizing surface of an incident-side polarizer of the spatial light modulation element can be more easily aligned, wherefore light utilization efficiency can be improved.

In the above projection type display device, the red semiconductor laser light source and the blue semiconductor laser light source are preferably arranged such that polarizing surfaces thereof are parallel.

With this construction, since the red semiconductor laser light source and the blue semiconductor laser light source are arranged such that the polarizing surfaces thereof are parallel, the polarizing surfaces of the laser lights incident on the spatial light modulation element can be made unidirectional, and the polarizing surface of an incident-side polarizer of the spatial light modulation element can be more easily aligned, wherefore light utilization efficiency can be improved.

In the above projection type display device, it is preferable that the laser light source unit includes a red laser light source for emitting a red laser light, a blue laser light source for emitting a blue laser light and a green laser light source for emitting a green laser light; and that the red and blue laser light sources are arranged symmetrically with respect to the optical axis of the homogenizer; and that the green laser light source is arranged on the optical axis of the homogenizer.

With this construction, the red laser light source for emitting a red laser light and the blue laser light source for emitting a blue laser light are arranged symmetrically with respect to the optical axis of the homogenizer, and the green laser light source for emitting a green laser light is arranged on the optical axis of the homogenizer. Thus, the spatial light modulation element is irradiated with illumination lights of three primary colors, wherefore a full color image can be displayed.

In the above projection type display device, it is preferable that the red and blue laser light sources include semiconductor laser light sources; and that the green laser light source includes a semiconductor laser light source for excitation for emitting an excitation laser light, a laser medium to be excited by a laser light emitted from the semiconductor laser light source for excitation and a wavelength conversion element for emitting the green laser light by converting the wavelength of the laser light emitted from the laser medium.

With this construction, the red and blue laser lights are emitted from the semiconductor laser light sources. The excitation laser light is emitted from the semiconductor laser light source for excitation, the laser medium is excited by the laser light emitted from the semiconductor laser light source for excitation and the wavelength of the laser light emitted from the laser medium is converted by the wavelength conversion element to emit the green laser light. Accordingly, the green laser light source having a more complicated construction than the red and blue laser light sources as semiconductor lasers is arranged on the optical axis of the homogenizer. Therefore, the miniaturization of the device can be realized.

In the above projection type display device, it is preferable that the plurality of focusing lenses include a focusing lens for red for focusing a red laser light emitted from the red laser light source on one point, a focusing lens for blue for focusing a blue laser light emitted from the blue laser light source on one point and a focusing lens for green for focusing a green laser light emitted from the green laser light before being incident on the homogenizer; and that an angle between the optical axis of the homogenizer and the outermost edge of the green laser light at the focal point of the focusing lens for green is equal to an angle between the optical axis of the homogenizer and the red or blue laser light at the focal point of the focusing lens for red or the focusing lens for blue.

With this construction, the red laser light emitted from the red laser light source is focused on one point by the focusing lens for red, the blue laser light emitted from the blue laser light source is focused on one point by the focusing lens for blue and the green laser light emitted from the green laser light source is focused before being incident on the homegenizer. The angle between the optical axis of the homogenizer and the outermost edge of the green laser light at the focal point of the focusing lens for green is equal to the angle between the optical axis of the homogenizer and the red or blue laser light at the focal point of the focusing lens for red or blue.

Accordingly, even if the green laser light source is arranged on the optical axis of the homogenizer, the green laser light is incident at a specified angle to the incident surface of the homogenizer. Thus, the light quantity distribution of the green laser light can be homogenized approximately to the same extent as those of the red and blue laser lights, wherefore the occurrence of color nonuniformity can be suppressed.

In the above projection type display device, the laser light source unit is preferably arranged such that the longer axis direction of the light emission region and the longer side direction of the incident surface of the homogenizer are parallel if the length of the laser light in the longer axis on the incident surface of the homogenizer is longer than that of the shorter sides of the homogenizer.

With this construction, the laser light source unit is arranged such that the longer axis direction of the light emission region and the longer side direction of the incident surface of the homogenizer are parallel if the length of the laser light in the longer axis on the incident surface of the homogenizer is longer than that of the shorter sides of the homogenizer. Thus, the laser light emitted from the laser light source unit can be efficiently introduced to the homogenizer. Further, if the length of the laser light in the longer axis on the incident surface of the homogenizer is shorter than that of the shorter sides of the homogenizer, the laser light is introduced to the homogenizer without being shaded even if the longer axis direction of the light emission region and the longer side direction of the incident surface of the homogenizer are not made parallel. Thus, if the length of the laser light in the longer axis on the incident surface of the homogenizer is shorter than that of the shorter sides of the homogenizer, it may not be necessary to set the longer axis direction of the light emission region and the longer side direction of the incident surface of the homogenizer parallel, wherefore the laser light source unit and the homogenizer can be freely arranged.

A light source device according to another aspect of the present invention comprises a laser light source unit having a light emission region for emitting an elliptical laser light; a focusing lens unit for focusing the laser light emitted from the laser light source unit; and a homogenizer having a rectangular incident surface on luminous flux focused by the focusing lens unit, wherein the incident surface of the homogenizer has a rectangular shape and the laser light source unit is arranged such that a longer axis direction of the light emission region and a longer side direction of the incident surface of the homogenizer are parallel.

With this construction, the laser light source unit has the light emission region for emitting an elliptical laser light, the laser light emitted from the laser light source unit is focused by the focusing lens unit, and the homogenizer is arranged to locate the rectangular incident surface on the luminous flux focused by the focusing lens unit. The incident surface of the homogenizer has the rectangular shape and the laser light source unit is arranged such that the longer axis direction of the light emission region and the longer side direction of the incident surface of the homogenizer are parallel.

Since the laser light source unit is arranged such that the longer axis direction of the light emission region of the laser light source unit and the longer side direction of the incident surface of the homogenizer are parallel, the laser light emitted from the laser light source unit can be efficiently introduced to the homogenizer and the arrangement of the laser light source unit and the homogenizer is optimized, wherefore miniaturization can be realized and high-output lights can be obtained from the homogenizer.

A projection type display device according to still another aspect of the present invention comprises a plurality of laser light sources; a plurality of focusing lenses provided in a one-to-one correspondence with the plurality of laser light sources for focusing the laser lights emitted from the plurality of laser light sources; a homogenizer having a rectangular incident surface on luminous fluxes focused by the plurality of focusing lenses; a spatial light modulation element for modulating the laser lights emitted from the homogenizer; and a projection lens for projecting the laser lights modulated by the spatial light modulation element, wherein the plurality of laser light sources include a red laser light source for emitting a red laser light, a blue laser light source for emitting a blue laser light and a green laser light source for emitting a green laser light; the red and blue laser light sources are arranged symmetrically with respect to the optical axis of the homogenizer; the green laser light source is arranged on the optical axis of the homogenizer; the plurality of focusing lenses include a focusing lens for red for focusing a red laser light emitted from the red laser light source on the incident surface of the homogenizer, a focusing lens for blue for focusing a blue laser light emitted from the blue laser light source on the incident surface of the homogenizer and a focusing lens for green for focusing a green laser light emitted from the green laser light before being incident on the homogenizer; and an angle between the optical axis of the homogenizer and the outermost edge of the green laser light at a focal point of the focusing lens for green is equal to an angle between the optical axis of the homogenizer and the red or blue laser light at a focal point of the focusing lens for red or the focusing lens for blue.

With this construction, the laser lights emitted from the plurality of laser light sources are focused by the plurality of focusing lenses provided in a one-to-one correspondence with the plurality of laser light sources. The homogenizer has the rectangular incident surface on the luminous fluxes focused by the plurality of focusing lenses, the laser lights emitted from the homogenizer are modulated by the spatial light modulation element and the laser lights modulated by the spatial light modulation element are projected by the projection lens. The red laser light source for emitting a red laser light and the blue laser light source for emitting a blue laser light are arranged symmetrically with respect to the optical axis of the homogenizer, and the green laser light source for emitting a green laser light is arranged on the optical axis of the homogenizer. The red laser light emitted from the red laser light source is focused on one point by the focusing lens for red, the blue laser light emitted from the blue laser light source is focused on one point by the focusing lens for blue, and the green laser light emitted from the green laser light source is focused before being incident on the homogenizer by the focusing lens for green. The angle between the optical axis of the homogenizer and the outermost edge of the green laser light at the focal point of the focusing lens for green is equal to the angle between the optical axis of the homogenizer and the red or blue laser light at the focal point of the focusing lens for red or blue.

Accordingly, the green laser light source having a more complicated construction than the red and blue laser light sources as semiconductor lasers is arranged on the optical axis of the homogenizer. Thus, the miniaturization of the device can be realized. Even if the green laser light source is arranged on the optical axis of the homogenizer, the green laser light is incident at a specified angle to the incident surface of the homogenizer. Thus, the light quantity distribution of the green laser light can be homogenized approximately to the same extent as those of the red and blue laser lights, wherefore the occurrence of color nonuniformity can be suppressed.

INDUSTRIAL APPLICABILITY

The projection type display device and the light source device according to the present invention can be miniaturized and can obtain high-output lights, and are useful as a front projector, a rear projector or the like using laser light sources. Further, by utilizing only the illumination optical system thereof, application to an illumination device, a back panel of a liquid crystal display and the like is possible.

What is claimed is:
1. A projection type display device, comprising:
  a laser light source unit having a light emission region for emitting an elliptical laser light;
  a focusing lens unit for focusing the laser light emitted from the laser light source unit;
  a lenticular lens for refracting the laser light focused by the focusing lens unit;
  a homogenizer having a rectangular incident surface on luminous flux focused by the focusing lens unit;
  a spatial light modulation element for modulating the laser light emitted from the homogenizer; and
  a projection lens for projecting the laser light modulated by the spatial light modulation element,
  wherein:
  the lenticular lens is rotatable about an axis parallel to an optical axis,
  the incident surface of the homogenizer has a rectangular shape, and
  the laser light source unit is arranged such that a longer axis direction of the light emission region and a longer side direction of the incident surface of the homogenizer are substantially parallel.
2. A projection type display device according to claim 1, wherein:
  the laser light source unit includes a plurality of semiconductor laser light sources;
  the focusing lens unit includes a plurality of focusing lenses provided in a one-to-one correspondence with the plurality of semiconductor laser light sources for focusing laser lights emitted from the plurality of semiconductor laser light sources on one point; and
  the homogenizer has the rectangular incident surface on a focal point of a plurality of laser lights.
3. A projection type display device according to claim 2, wherein the plurality of semiconductor laser light sources are arranged symmetrically with respect to an optical axis of the homogenizer.
4. A projection type display device according to claim 3, wherein:
  the laser light source unit includes a plurality of semiconductor laser light sources;
  the focusing lens unit includes a plurality of collimator lenses provided in a one-to-one correspondence with the plurality of semiconductor laser light sources for collimating laser lights emitted from the plurality of semiconductor laser light sources, a convex lens for focusing the laser lights collimated by the condenser lenses and a concave lens disposed between the convex lens and a focal point of the convex lens; and the homogenizer has the rectangular incident surface on a focal point of a combined lens comprised of the convex lens and the concave lens.

5. A projection type display device according to claim 4, wherein:
the laser light source unit includes a red laser light source for emitting a red laser light, a blue laser light source for emitting a blue laser light and a green laser light source for emitting a green laser light;
the red and blue laser light sources are arranged symmetrically with respect to the optical axis of the homogenizer; and
the green laser light source is arranged on the optical axis of the homogenizer.

6. A projection type display device according to claim 5, wherein:
the plurality of focusing lenses include a focusing lens for red for focusing a red laser light emitted from the red laser light source on one point, a focusing lens for blue for focusing a blue laser light emitted from the blue laser light source on one point and a focusing lens for green for focusing a green laser light emitted from the green laser light before being incident on the homogenizer; and
an angle between the optical axis of the homogenizer and the outermost edge of the green laser light at the focal point of the focusing lens for green is equal to an angle between the optical axis of the homogenizer and the red or blue laser light at the focal point of the focusing lens for red or the focusing lens for blue.

7. A projection type display device according to claim 6, wherein:
the red and blue laser light sources include semiconductor laser light sources; and
the green laser light source includes a semiconductor laser light source for excitation for emitting an excitation laser light, a laser medium to be excited by a laser light emitted from the semiconductor laser light source for excitation and a wavelength conversion element for emitting the green laser light by converting the wavelength of the laser light emitted from the laser medium.

8. A projection type display device according to claim 7, wherein the plurality of semiconductor laser light sources include a red semiconductor laser light source for emitting a red laser light and a blue semiconductor laser light source for emitting a blue laser light.

9. A projection type display device according to claim 8, wherein:
the red semiconductor laser light source and the blue semiconductor laser light source are arranged such that the polarizing surfaces differ, and
the projection type display device further comprises a half-wave plate arranged on either one of an optical path of the laser light emitted from the red semiconductor laser light source until reaching the homogenizer and an optical path of the laser light emitted from the blue semiconductor laser light source until reaching the homogenizer to align the polarizing surfaces of the respective semiconductor laser light sources.

10. A projection type display device according to claim 9, wherein:
the laser light source unit includes a semiconductor laser light source having a plurality of light emission regions respectively arranged on a straight line; and
the semiconductor laser light source is arranged such that an arrangement direction of the plurality of light emission regions and a longer side direction of the incident surface of the homogenizer are parallel.

11. A projection type display device according to claim 10, wherein the laser light source unit is arranged such that the longer axis direction of the light emission regions and the longer side direction of the incident surface of the homogenizer are parallel if the length of the laser light in the longer axis on the incident surface of the homogenizer is longer than that of the shorter sides of the homogenizer.

12. A projection type display device according to claim 1, wherein:
the laser light source unit includes a semiconductor laser light source having a plurality of light emission regions respectively arranged on a straight line; and
the semiconductor laser light source is arranged such that an arrangement direction of the plurality of light emission regions and a longer side direction of the incident surface of the homogenizer are parallel.

13. A projection type display device according to claim 1, wherein:
the laser light source unit includes a plurality of semiconductor laser light sources;
the focusing lens unit includes a plurality of collimator lenses provided in a one-to-one correspondence with the plurality of semiconductor laser light sources for collimating laser lights emitted from the plurality of semiconductor laser light sources, a convex lens for focusing the laser lights collimated by the collimator lenses and a concave lens disposed between the convex lens and a focal point of the convex lens; and
the homogenizer has a rectangular incident surface at a focal point of a combined lens comprised of the convex lens and the concave lens.

14. A projection type display device according to claim 1, wherein
the laser light source unit includes a plurality of semiconductor laser light sources;
the focusing lens unit includes a plurality of collimator lenses provided in a one-to-one correspondence with the plurality of semiconductor laser light sources for collimating laser lights emitted from the plurality of semiconductor laser light sources, a first convex lens for focusing the laser lights collimated by the collimator lenses and a second convex lens disposed at a side of a focal point of the first convex lens opposite to the first convex lens for relaying the focused laser lights; and
the homogenizer has a rectangular incident surface at a focal point of the second convex lens.

15. A projection type display device according to claim 14, wherein the plurality of semiconductor laser light sources include a red semiconductor laser light source for emitting a red laser light and a blue semiconductor laser light source for emitting a blue laser light.

16. A projection type display device according to claim 15, wherein:
the red semiconductor laser light source and the blue semiconductor laser light source are arranged such that the polarizing surfaces differ, and
the projection type display device further comprises a half-wave plate arranged on either one of an optical path of the laser light emitted from the red semiconductor laser light source until reaching the homogenizer and an optical path of the laser light emitted from the blue semiconductor laser light source until reaching the homogenizer to align the polarizing surfaces of the respective semiconductor laser light sources.

17. A projection type display device according to claim 15, wherein the red semiconductor laser light source and the blue semiconductor laser light source are arranged such that polarizing surfaces thereof are parallel.

18. A projection type display device according to claim 1, wherein:
the laser light source unit includes a red laser light source for emitting a red laser light, a blue laser light source for emitting a blue laser light and a green laser light source for emitting a green laser light;
the red and blue laser light sources are arranged symmetrically with respect to the optical axis of the homogenizer; and
the green laser light source is arranged on the optical axis of the homogenizer.

19. A projection type display device according to claim 18, wherein:
the red and blue laser light sources include semiconductor laser light sources; and
the green laser light source includes a semiconductor laser light source for excitation for emitting an excitation laser light, a laser medium to be excited by a laser light emitted from the semiconductor laser light source for excitation and a wavelength conversion element for emitting the green laser light by converting the wavelength of the laser light emitted from the laser medium.

20. A projection type display device according to claim 18, wherein:
the plurality of focusing lenses include a focusing lens for red for focusing a red laser light emitted from the red laser light source on one point, a focusing lens for blue for focusing a blue laser light emitted from the blue laser light source on one point and a focusing lens for green for focusing a green laser light emitted from the green laser light before being incident on the homogenizer; and
an angle between the optical axis of the homogenizer and the outermost edge of the green laser light at the focal point of the focusing lens for green is equal to an angle between the optical axis of the homogenizer and the red or blue laser light at the focal point of the focusing lens for red or the focusing lens for blue.

21. A projection type display device according to claim 1, wherein the laser light source unit is arranged such that the longer axis direction of the light emission region and the longer side direction of the incident surface of the homogenizer are parallel if the length of the laser light in the longer axis on the incident surface of the homogenizer is longer than that of the shorter sides of the homogenizer.

22. A light source device, comprising:
a laser light source unit having a light emission region for emitting an elliptical laser light;
a focusing lens unit for focusing the laser light emitted from the laser light source unit;
a lenticular lens for refracting the laser light focused by the focusing lens unit; and
a homogenizer having a rectangular incident surface on luminous flux focused by the focusing lens unit,
wherein:
the lenticular lens is rotatable about an axis parallel to an optical axis,
the incident surface of the homogenizer has a rectangular shape, and
the laser light source unit is arranged such that a longer axis direction of the light emission region and a longer side direction of the incident surface of the homogenizer are substantially parallel.

23. A projection type display device, comprising:
a plurality of laser light sources;
a plurality of focusing lenses provided in a one-to-one correspondence with the plurality of laser light sources for focusing the laser lights emitted from the plurality of laser light sources;
a lenticular lens for refracting the laser light focused by the focusing lens;
a homogenizer having a rectangular incident surface on luminous fluxes focused by the plurality of focusing lenses;
a spatial light modulation element for modulating the laser lights emitted from the homogenizer; and
a projection lens for projecting the laser lights modulated by the spatial light modulation element,
wherein:
the lenticular lens is rotatable about an axis parallel to an optical axis,
the plurality of laser light sources include a red laser light source for emitting a red laser light, a blue laser light source for emitting a blue laser light and a green laser light source for emitting a green laser light;
the red and blue laser light sources are arranged symmetrically with respect to the optical axis of the homogenizer;
the green laser light source is arranged on the optical axis of the homogenizer;
the plurality of focusing lenses include a focusing lens for red for focusing a red laser light emitted from the red laser light source on the incident surface of the homogenizer, a focusing lens for blue for focusing a blue laser light emitted from the blue laser light source on the incident surface of the homogenizer and a focusing lens for green for focusing a green laser light emitted from the green laser light before being incident on the homogenizer; and
an angle between the optical axis of the homogenizer and the outermost edge of the green laser light at a focal point of the focusing lens for green is equal to an angle between the optical axis of the homogenizer and the red or blue laser light at a focal point of the focusing lens for red or the focusing lens for blue.

* * * * *